(12) United States Patent
Huang et al.

(10) Patent No.: US 12,125,912 B2
(45) Date of Patent: Oct. 22, 2024

(54) SEMICONDUCTOR DEVICE STRUCTURE AND METHOD FOR FORMING THE SAME PRELIMINARY CLASS

(71) Applicant: Taiwan Semiconductor Manufacturing Company, Ltd., Hsinchu (TW)

(72) Inventors: Lin-Yu Huang, Hsinchu (TW); Jia-Chuan You, Taoyuan (TW); Chia-Hao Chang, Hsinchu (TW); Tien-Lu Lin, Hsinchu (TW); Yu-Ming Lin, Hsinchu (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/302,452

(22) Filed: Apr. 18, 2023

(65) Prior Publication Data

US 2023/0261109 A1    Aug. 17, 2023

Related U.S. Application Data

(60) Continuation of application No. 17/379,446, filed on Jul. 19, 2021, now Pat. No. 11,658,244, which is a division of application No. 16/548,423, filed on Aug. 22, 2019, now Pat. No. 11,069,811.

(51) Int. Cl.
*H01L 29/78* (2006.01)
*H01L 21/308* (2006.01)
*H01L 21/768* (2006.01)
*H01L 29/66* (2006.01)

(52) U.S. Cl.
CPC ........ *H01L 29/785* (2013.01); *H01L 21/3081* (2013.01); *H01L 21/3086* (2013.01); *H01L 21/76816* (2013.01); *H01L 21/76877* (2013.01); *H01L 29/66795* (2013.01)

(58) Field of Classification Search
CPC ................ H01L 29/785; H01L 29/66795
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |

(Continued)

*Primary Examiner* — Peniel M Gumedzoe
(74) *Attorney, Agent, or Firm* — Birch, Stewart, Kolasch & Birch, LLP

(57) ABSTRACT

A semiconductor device structure is provided. The semiconductor device structure includes a contact over a source/drain region of a fin structure, a gate stack over a channel region of the fin structure, a first mask layer covering the gate stack, and a second mask layer covering the contact. A side surface of the first mask layer is direct contact with a side surface of the second mask layer, and the first mask layer includes a portion directly below the second mask layer.

20 Claims, 28 Drawing Sheets

(56) References Cited

U.S. PATENT DOCUMENTS

| | | |
|---|---|---|
| 9,548,366 B1 | 1/2017 | Ho et al. |
| 9,576,814 B2 | 2/2017 | Wu et al. |
| 10,157,790 B1 | 12/2018 | You et al. |
| 2018/0219010 A1* | 8/2018 | Kim .................. H01L 21/76825 |
| 2018/0350662 A1 | 12/2018 | You et al. |
| 2020/0044072 A1 | 2/2020 | Chiang et al. |

* cited by examiner

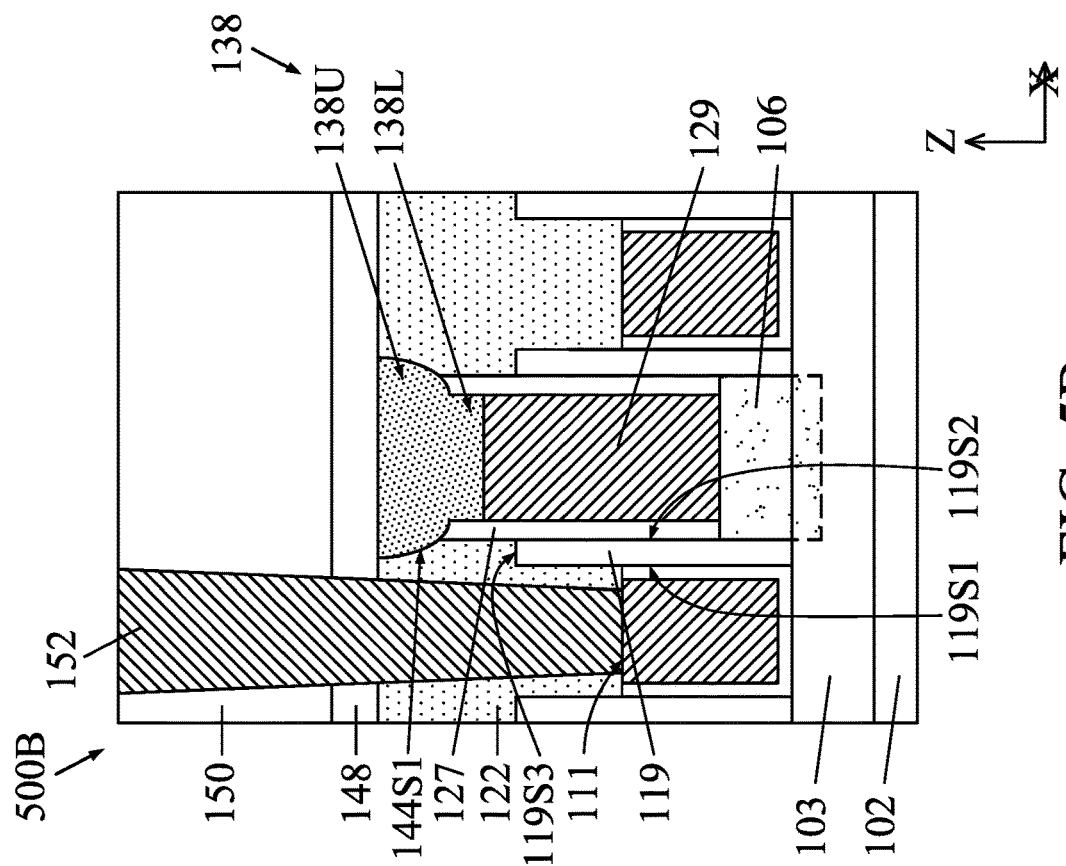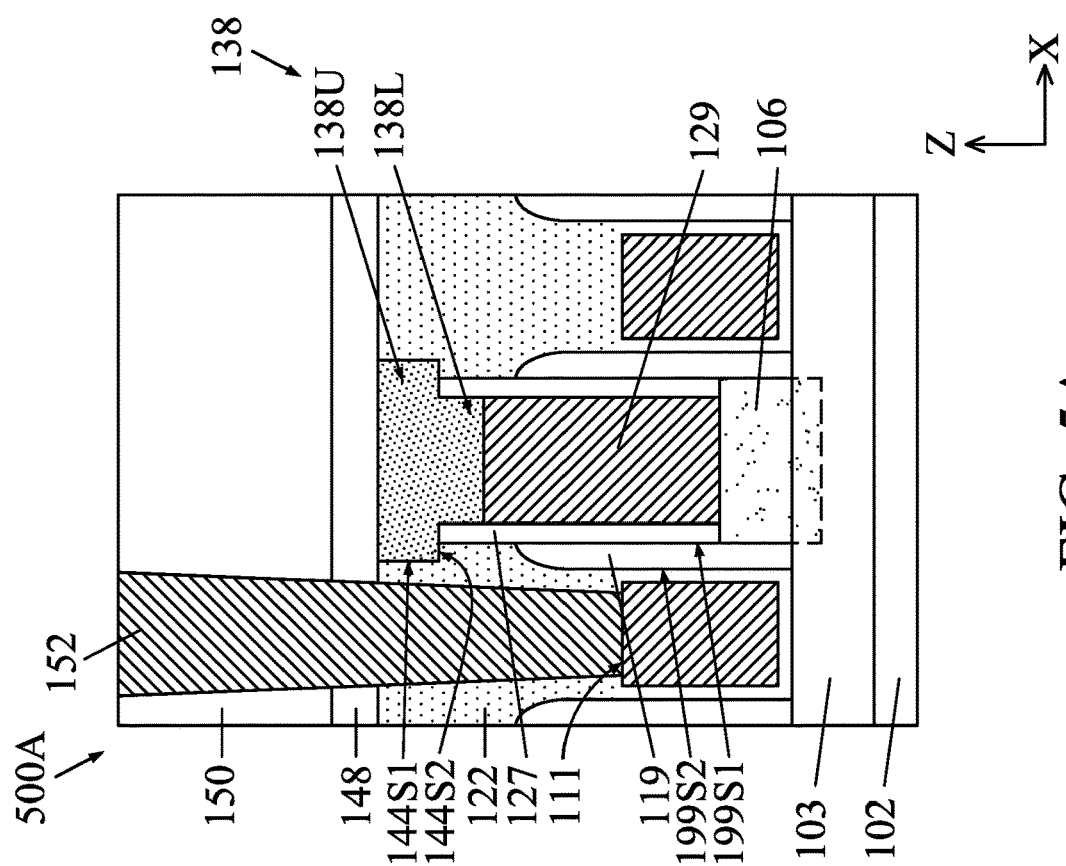

SEMICONDUCTOR DEVICE STRUCTURE AND METHOD FOR FORMING THE SAME PRELIMINARY CLASS

PRIORITY CLAIM AND CROSS-REFERENCE

This application is a Continuation Application of U.S. application Ser. No. 17/379,446, filed on Jul. 19, 2021, entitled "SEMICONDUCTOR DEVICE STRUCTURE," which is a divisional application of U.S. patent application Ser. No. 16/548,423 (now U.S. Pat. No. 11,069,811), filed on Aug. 22, 2019, entitled of "SEMICONDUCTOR DEVICE STRUCTURE AND METHOD FOR FORMING THE SAME," which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C-1, 2D-1, 2E-1, 2F-1, 2G-1, 2H-1, 2I-1, and 2I-2 are cross-sectional views illustrating the formation of a semiconductor device at various intermediate stages, in accordance with some embodiments of the disclosure.

FIGS. 2A-2, 2B-2, 2C-2, 2D-2, 2E-2, 2F-2, 2G-2, 2H-2, and 2I-3 are top views illustrating the formation of a semiconductor device at various intermediate stages, in accordance with some embodiments of the disclosure.

FIGS. 2G-3 and 2H-3 are portions of the cross-sectional views of FIGS. 2G-1 and 2H-1, respectively, to further illustrate additional details, in accordance with some embodiments.

FIGS. 3, 4A, 4B, 4C, 4D, 5A, 5B, and 5C are modifications of a portion of FIG. 2I-1 in accordance with some embodiments.

DETAILED DESCRIPTION

Figure 1:
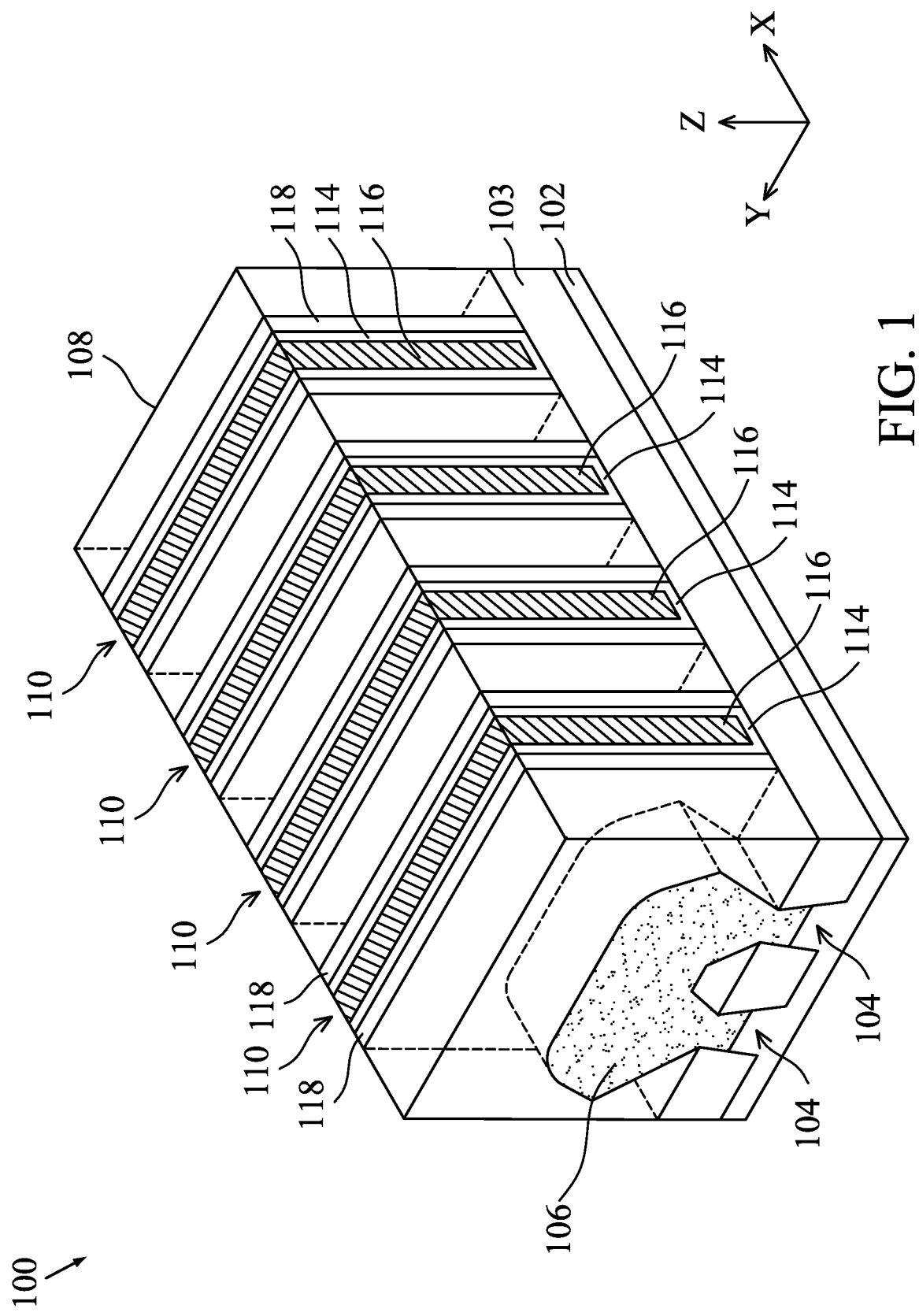
FIG. 1 is a perspective view of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of forming a semiconductor device structure are provided. The method for forming the semiconductor device structure may include forming a first mask layer covering the gate stack, etching the first mask layer, and forming a second mask layer covering the source/drain contact and a portion of the first mask layer. The second mask layer may protect the first mask layer during the subsequent etching process for forming a gate via. As a result, the via-to-gate overlay window and the time-dependent dielectric breakdown (TDDB) window of the semiconductor device may be improved, which enhances the reliability of the semiconductor device.

FIG. 1 is a perspective view of a semiconductor device structure 100, in accordance with some embodiments of the disclosure. A semiconductor device structure 100 is provided, as shown in FIG. 1, in accordance with some embodiments.

The semiconductor device structure 100 is a FinFET device structure, in accordance with some embodiments. The formation of the semiconductor device structure 100 includes providing a substrate 102, and forming fin structures 104 and an isolation structure 103 on the substrate 102, in accordance with some embodiments. The isolation structure 103 surrounds the fin structures 104, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The fin structures 104 are arranged in the Y direction and extend in the X direction, in accordance with some embodiments. In some embodiments, the formation of the fin structures 104 includes recessing the substrate 102 to form trenches. In some embodiments, the fin structures 104 are formed protruding from between the trenches.

Afterward, the trenches are filled with an insulating material for the isolation structure 103, in accordance with some embodiments. The insulating material is also formed over the upper surfaces of the fin structures 104, in accordance with some embodiments. In some embodiments, the insulating material includes silicon oxide, silicon nitride, silicon oxynitride (SiON), another suitable insulating material, and/or a combination thereof. In some embodiments, the insulating material is formed using chemical vapor deposition (CVD) such as low pressure CVD (LPCVD), plasma enhanced CVD (PECVD), or high density plasma CVD (HDP-CVD), high aspect ratio process (HARP), flowable CVD (FCVD)); atomic layer deposition (ALD); another suitable method, and/or a combination thereof.

The insulating material over the upper surfaces of the fin structures 104 is removed to expose the upper surfaces of the fin structures 104, for example, using chemical mechanical polishing (CMP), in accordance with some embodiments. Afterward, the insulating material is recessed to expose an upper portion of the sidewalls of the fin structures 104 and forms the isolation structure 103 surrounding lower portions of the fin structures 104, in accordance with some embodiments.

In some embodiments, the semiconductor device structure 100 is formed using a gate-late process. For example, dummy gate structures including dummy gate dielectric layers and dummy gate electrode layers (not shown) may be formed across the fin structures 104 in the place where gate stacks are to be formed.

The formation of the semiconductor device structure 100 further includes forming gate spacer layers 118 along opposite sides of the dummy gate structures, in accordance with some embodiments. In some embodiments, the gate spacer layer 118 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

The formation of the semiconductor device structure 100 further includes forming source/drain features 106 on the fin structures 104, in accordance with some embodiments. The source/drain features 106 are formed on the opposite sides of the dummy gate structures, in accordance with some embodiments. In some embodiments, the source/drain features 106 on the adjacent fin structures 104 merge to form a continuous source/drain feature 106, as shown in FIG. 1. In some embodiments, the source/drain features 106 on the adjacent fin structures do not merge together and remain separate source/drain features.

The formation of the source/drain features 106 includes recessing the fin structures 104 to form source/drain recesses on opposite sides of the dummy gate structures, in accordance with some embodiments. The recesses may have bottom surfaces that are located at a level substantially the same as or lower than the upper surface of the isolation structure 103. Afterward, the source/drain features 106 are grown in the source/drain recesses using an epitaxial growth process, in accordance with some embodiments.

In some embodiments, the source/drain features 106 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 106 are in-situ doped during the epitaxial growth process. For example, the source/drain features 106 may be the epitaxially grown SiGe doped with boron (B). For example, the source/drain features 106 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features.

The formation of the semiconductor device structure 100 further includes forming a lower interlayer dielectric (ILD) layer 108 over the substrate 102, in accordance with some embodiments. The lower ILD layer 108 covers the isolation structure 103, the fin structures 104, and the source/drain features 106, in accordance with some embodiments. In some embodiments, the upper surface of the lower ILD layer 108 is substantially coplanar with the upper surfaces of the dummy gate structures.

In some embodiments, the lower ILD layer 108 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the ILD layer is formed using CVD (such as HDP-CVD, PECVD, or HARP), ALD, another suitable method, and/or a combination thereof. In some embodiments, after the dielectric material for lower ILD layer 108 is formed, the dielectric material over the dummy gate structures are removed using such as CMP, until the upper surfaces of the dummy gate structures are exposed.

The dummy gate structures are replaced with gate stacks 110, in accordance with some embodiments. The replacement process may include removing the dummy gate structures using one or more etching process to form trenches, and forming the gate stacks 110 in the trenches. The gate stacks 110 extend across the fin structures 104, in accordance with some embodiments. The gate stacks 110 are arranged in the X direction and extend in the Y direction, in accordance with some embodiments.

In some embodiments, each gate stack 110 includes an interfacial layer (not shown in FIG. 1 but in FIG. 2A-1), a gate dielectric layer 114 formed on the interfacial layer, and a gate electrode layer 116 formed on the gate dielectric layer 114. In some embodiments, the interfacial layer is made of silicon oxide ($SiO_2$), HfSiO, or silicon oxynitride (SiON). The interfacial layer may be formed on the exposed surface of the fin structures 104 by chemical oxidation, thermal oxidation, ALD, CVD, and/or another suitable method.

In some embodiments, the gate dielectric layer 114 is made of a dielectric material with high dielectric constant (k value), for example, greater than 3.9. In some embodiments, the high-K dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or another suitable material. The high-K gate dielectric layer may be formed by ALD, physical vapor deposition (PVD), CVD, thermal oxidation, and/or another suitable method.

In some embodiments, the gate electrode layer 116 includes a conductive material, such as doped semiconductor, a metal, metal alloy, or metal silicide. In some embodiments, the gate electrode layer 116 includes a single layer or alternatively a multi-layer structure, such as various combinations of a metal layer with a selected work function to enhance the device performance (work function metal layer), a liner layer, a wetting layer, an adhesion layer, a metal fill layer, and/or another suitable layer.

The gate electrode layer 116 may be made of doped polysilicon, doped poly-germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof. The gate electrode layer 116 may be formed by ALD, PVD, CVD, e-beam evaporation, or another suitable process. Further, the gate stack 110 may be formed separately for N-FET and P-FET transistors which may use different gate electrode materials and/or different work function materials.

Figures 1, 2A:
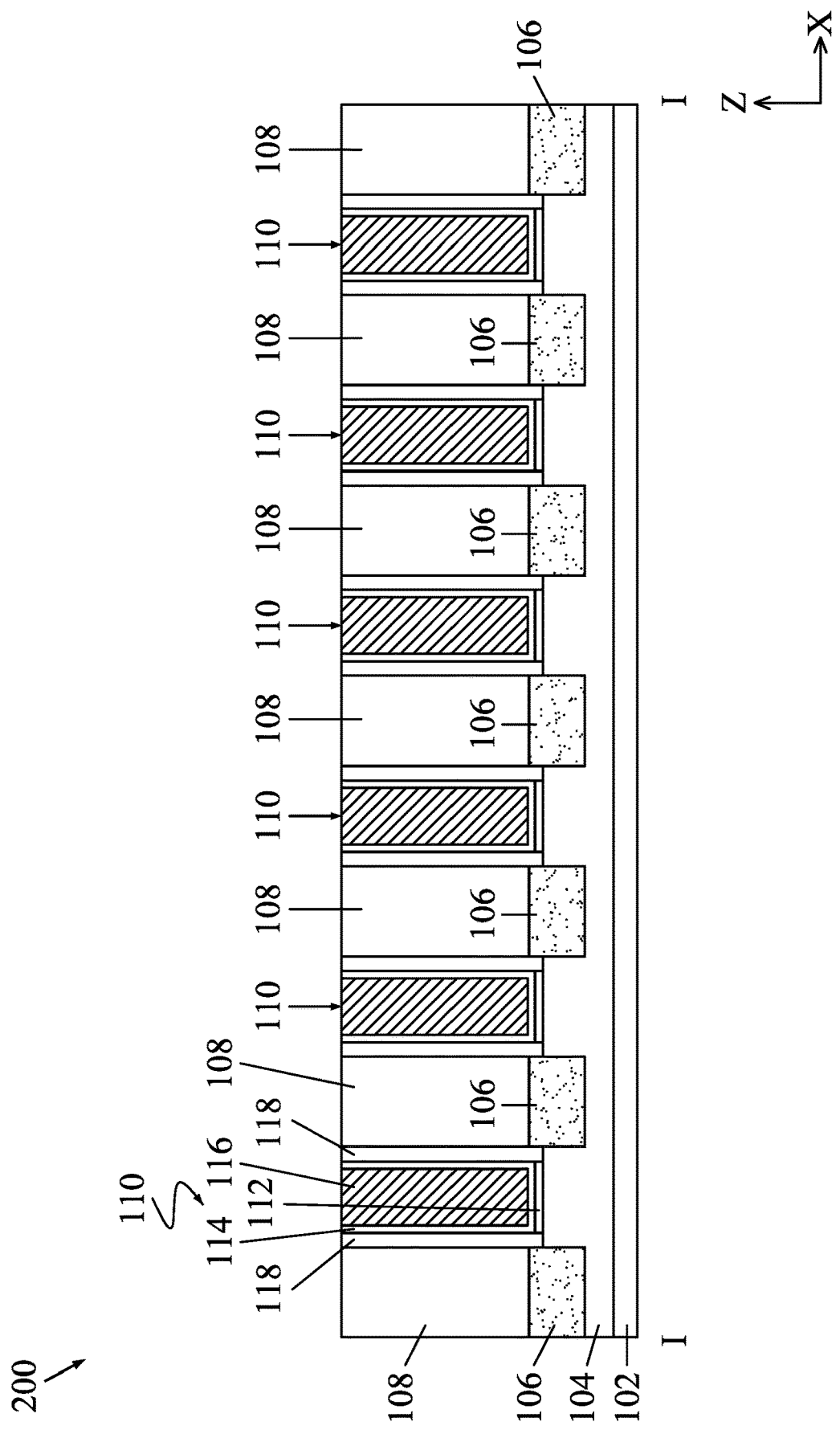
Figures 2, 2A:
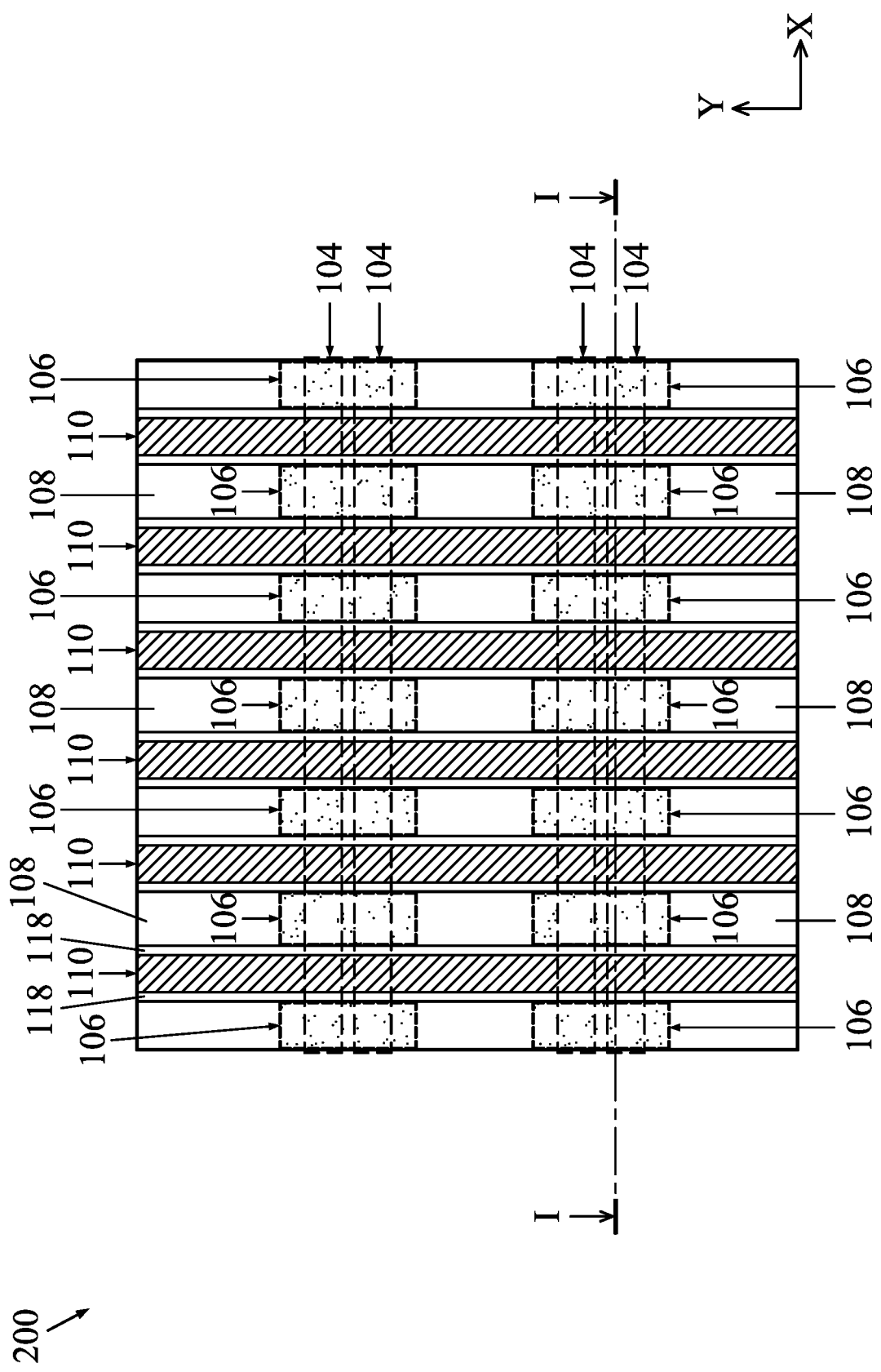
Figures 1, 2B:
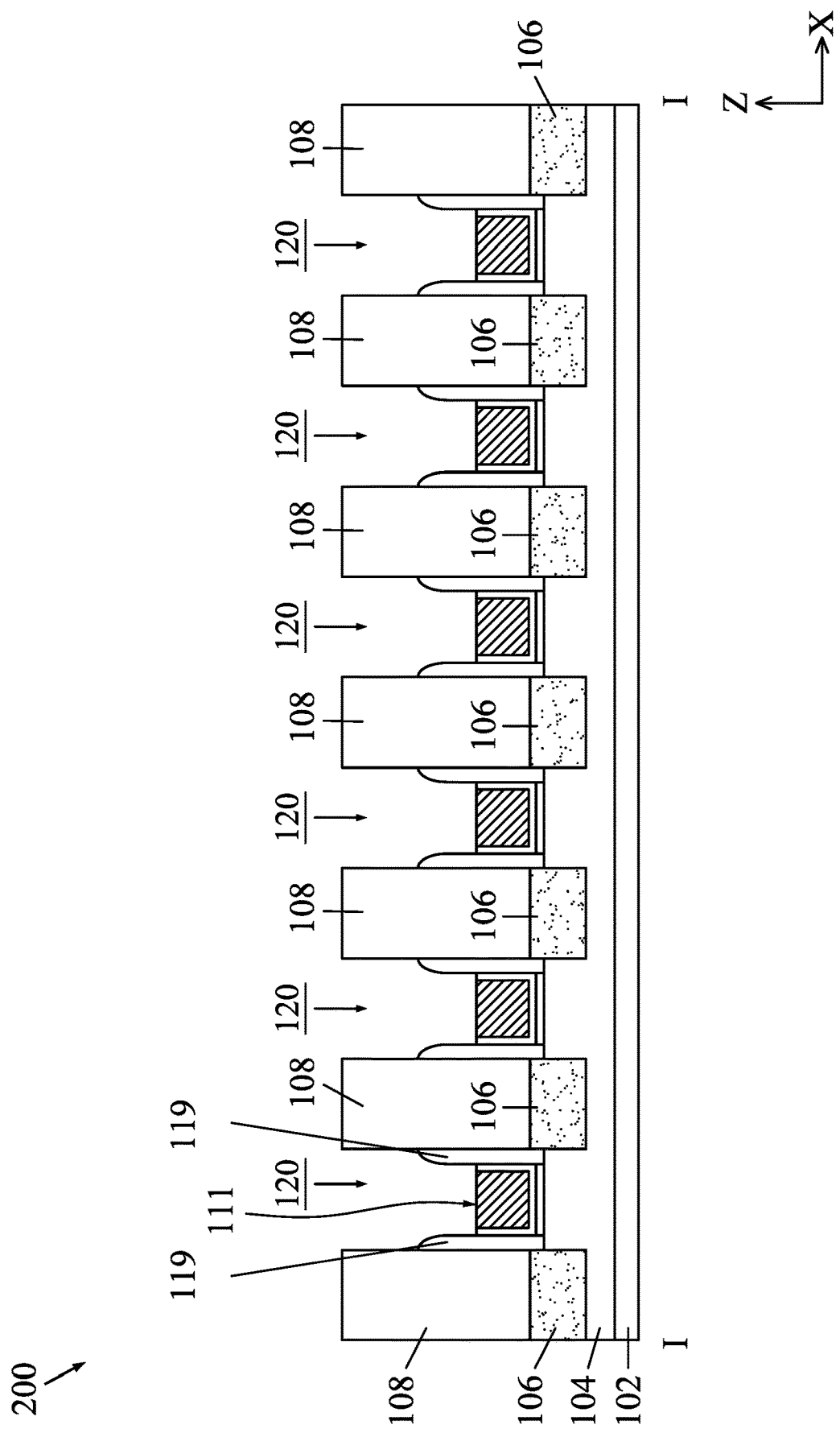
Figures 2, 2B:
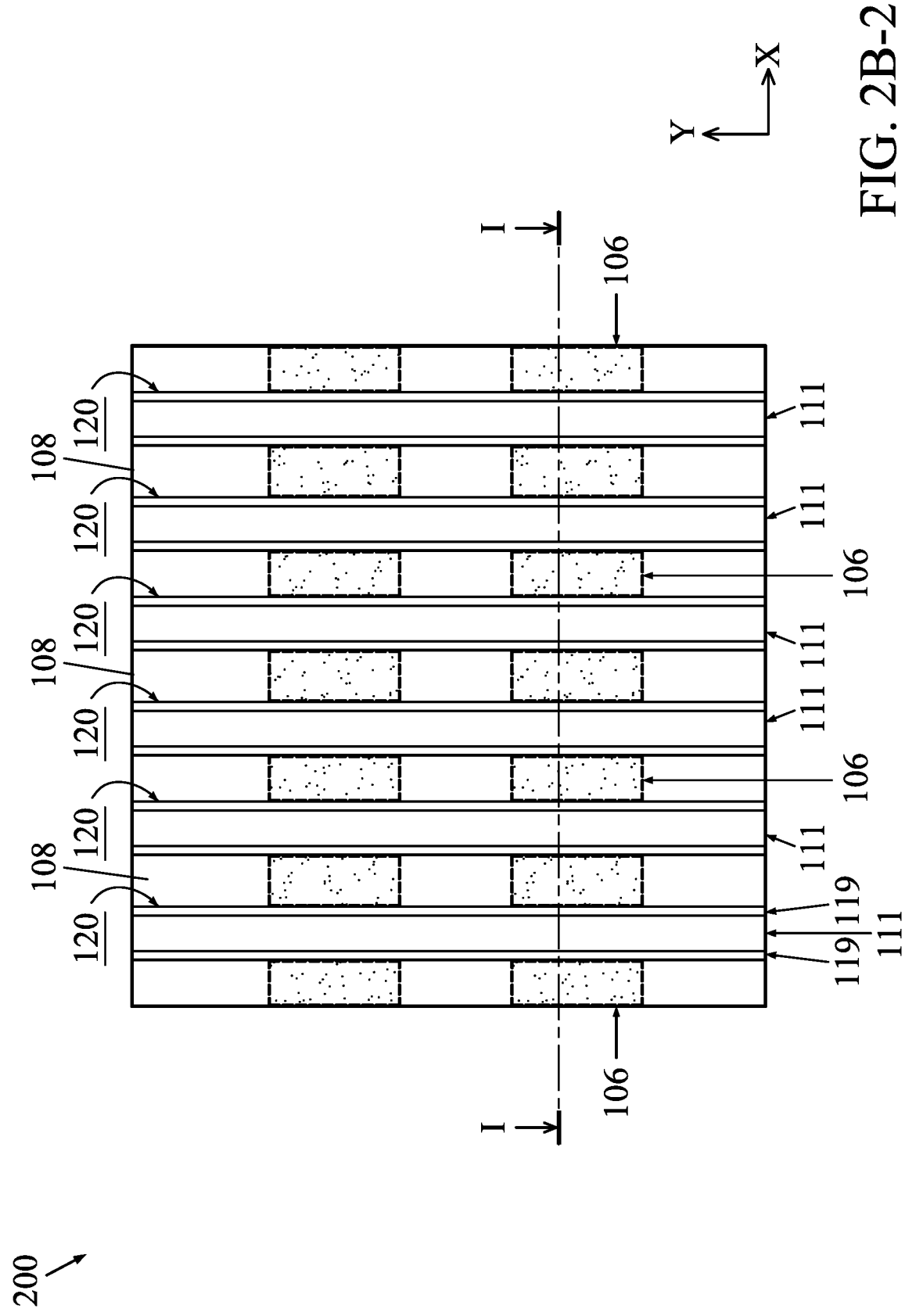
Figures 1, 2C:
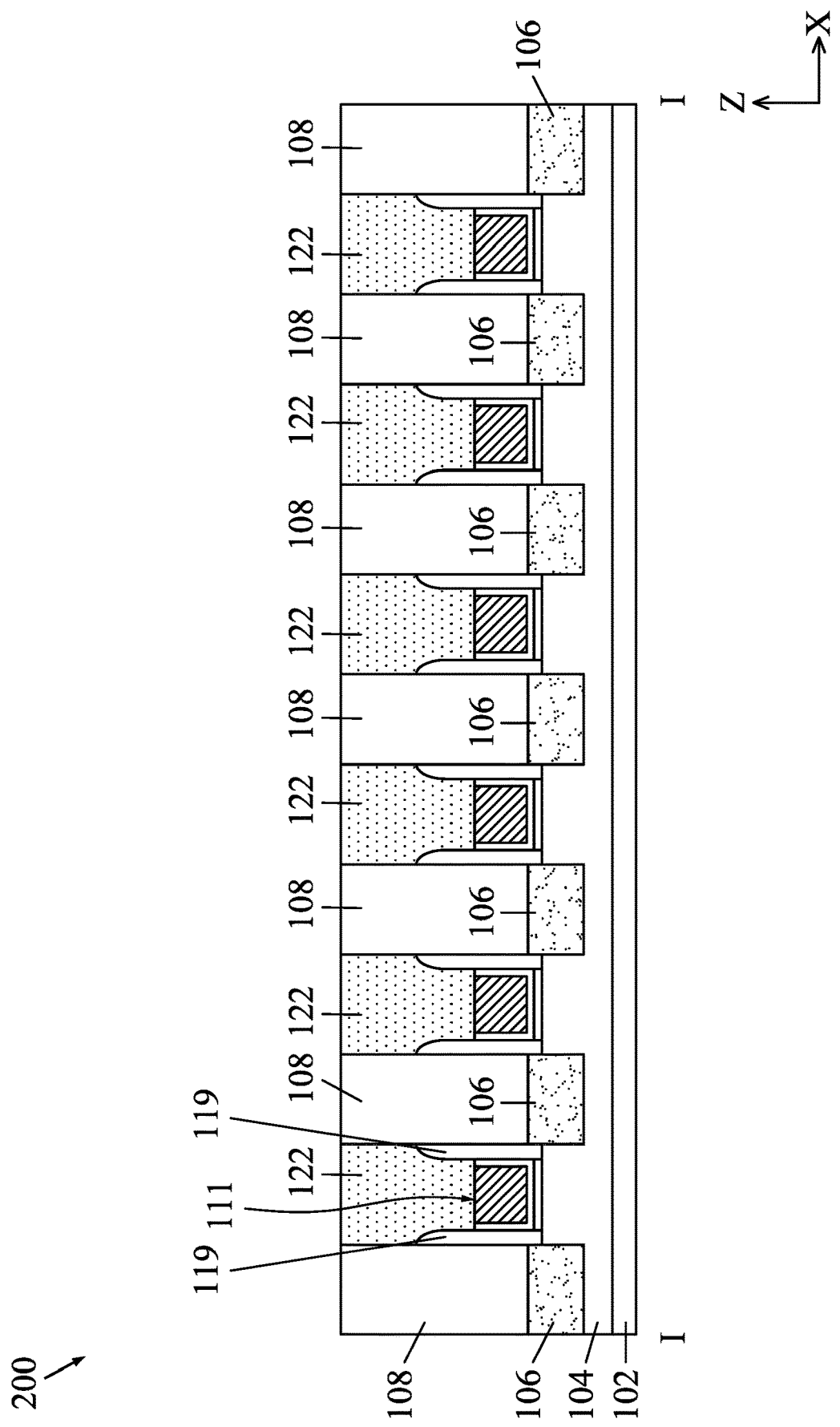
Figures 2, 2C:
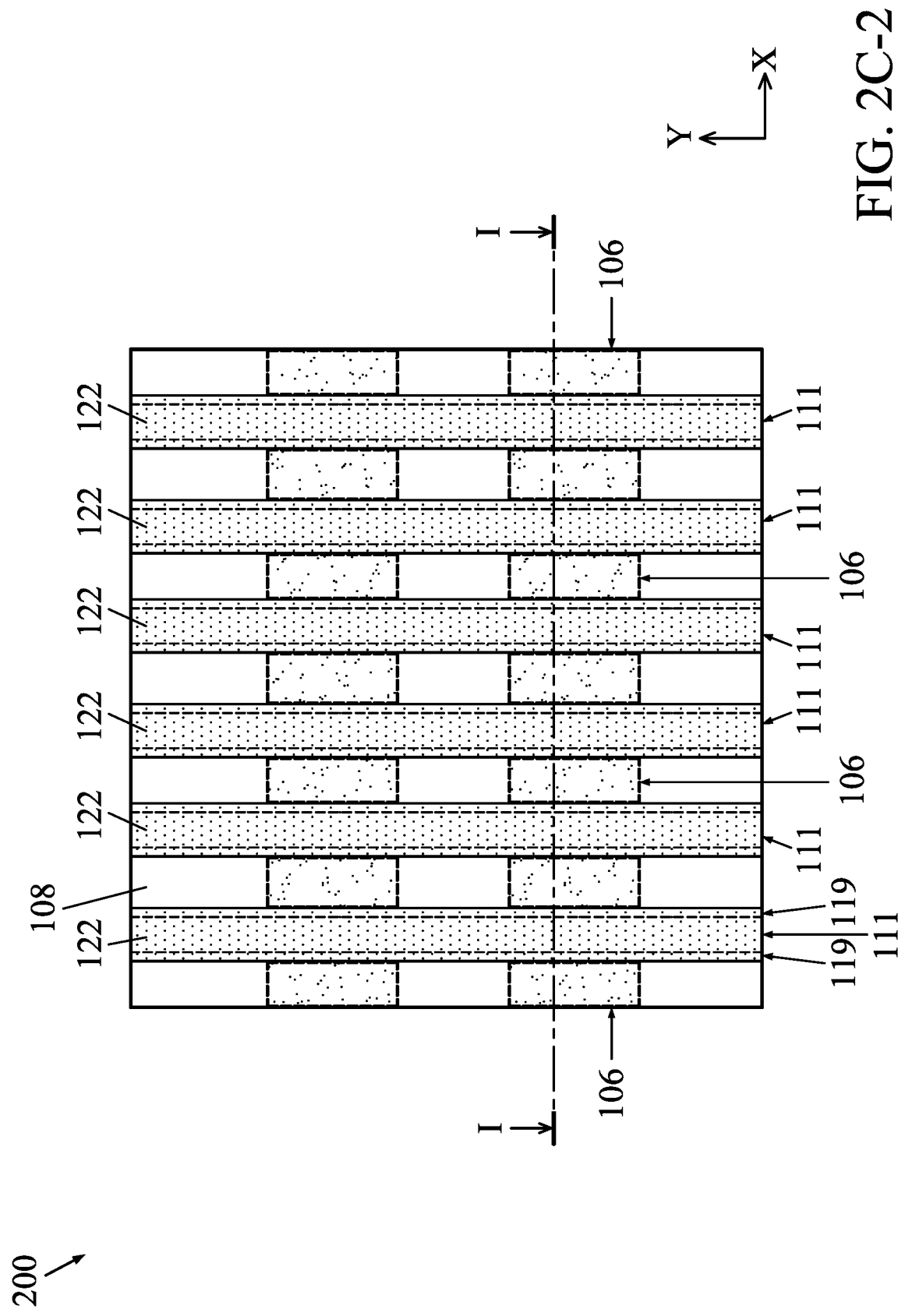
Figures 1, 2D:
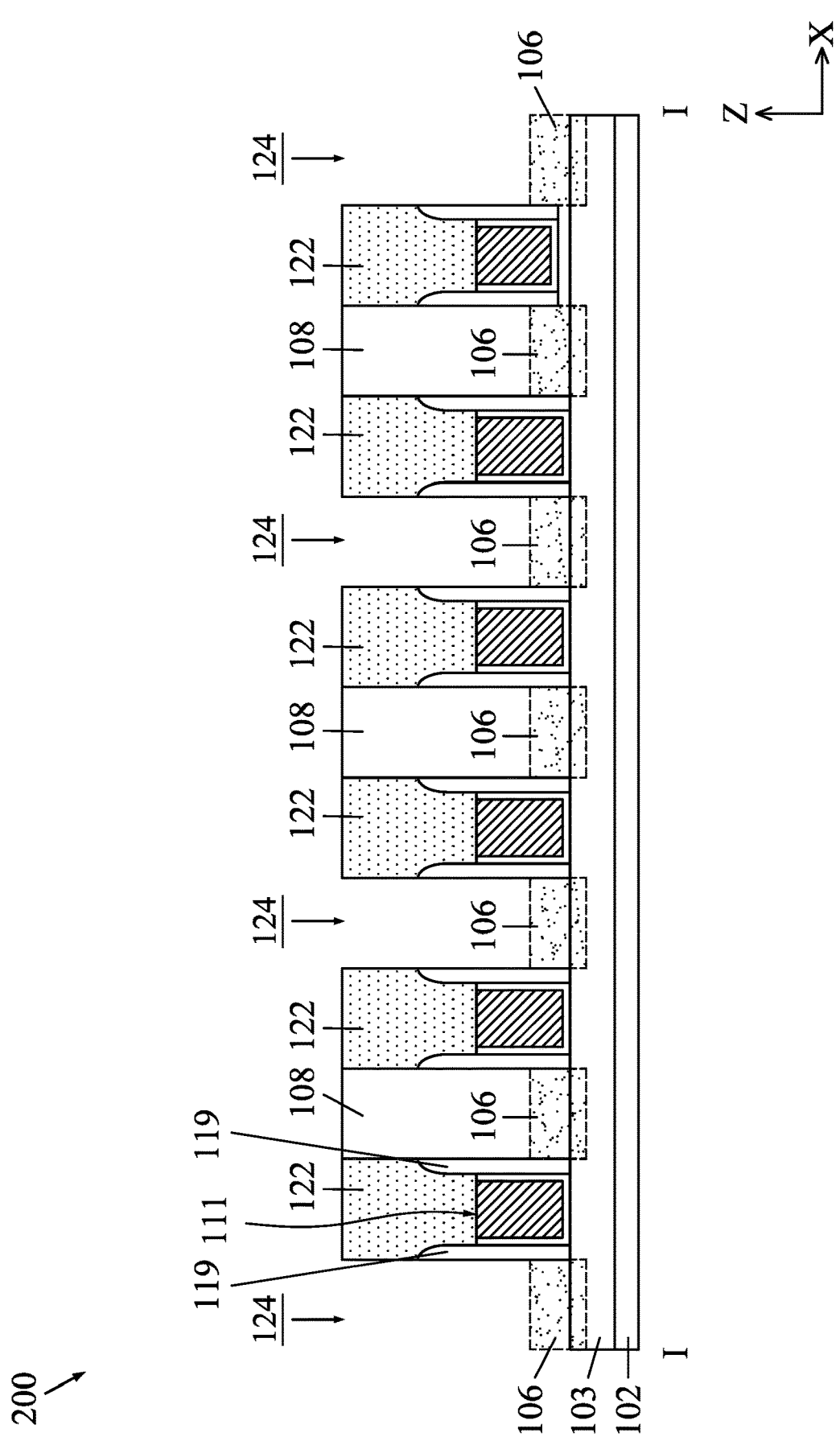
Figures 2, 2D:
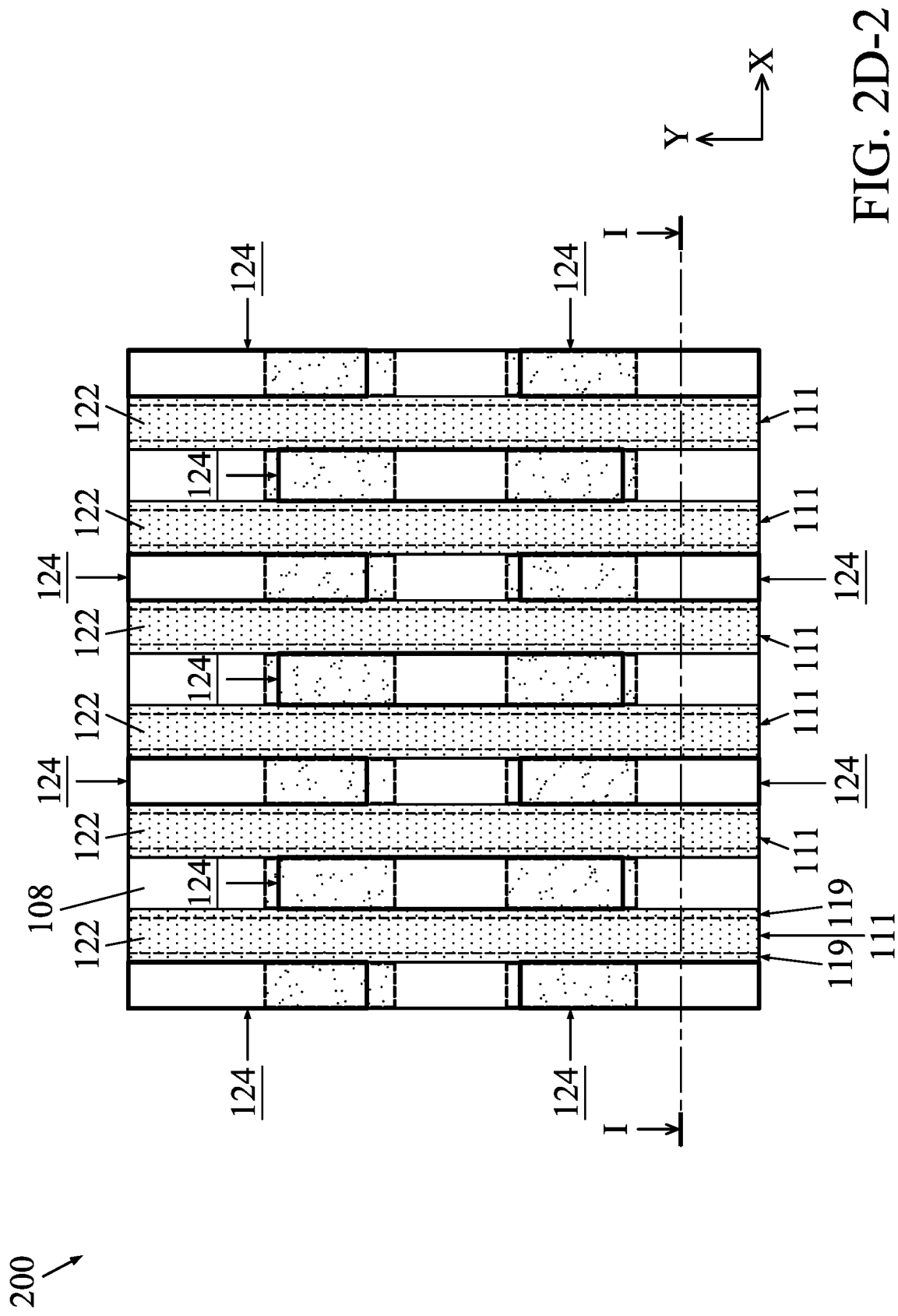
Figures 1, 2E:
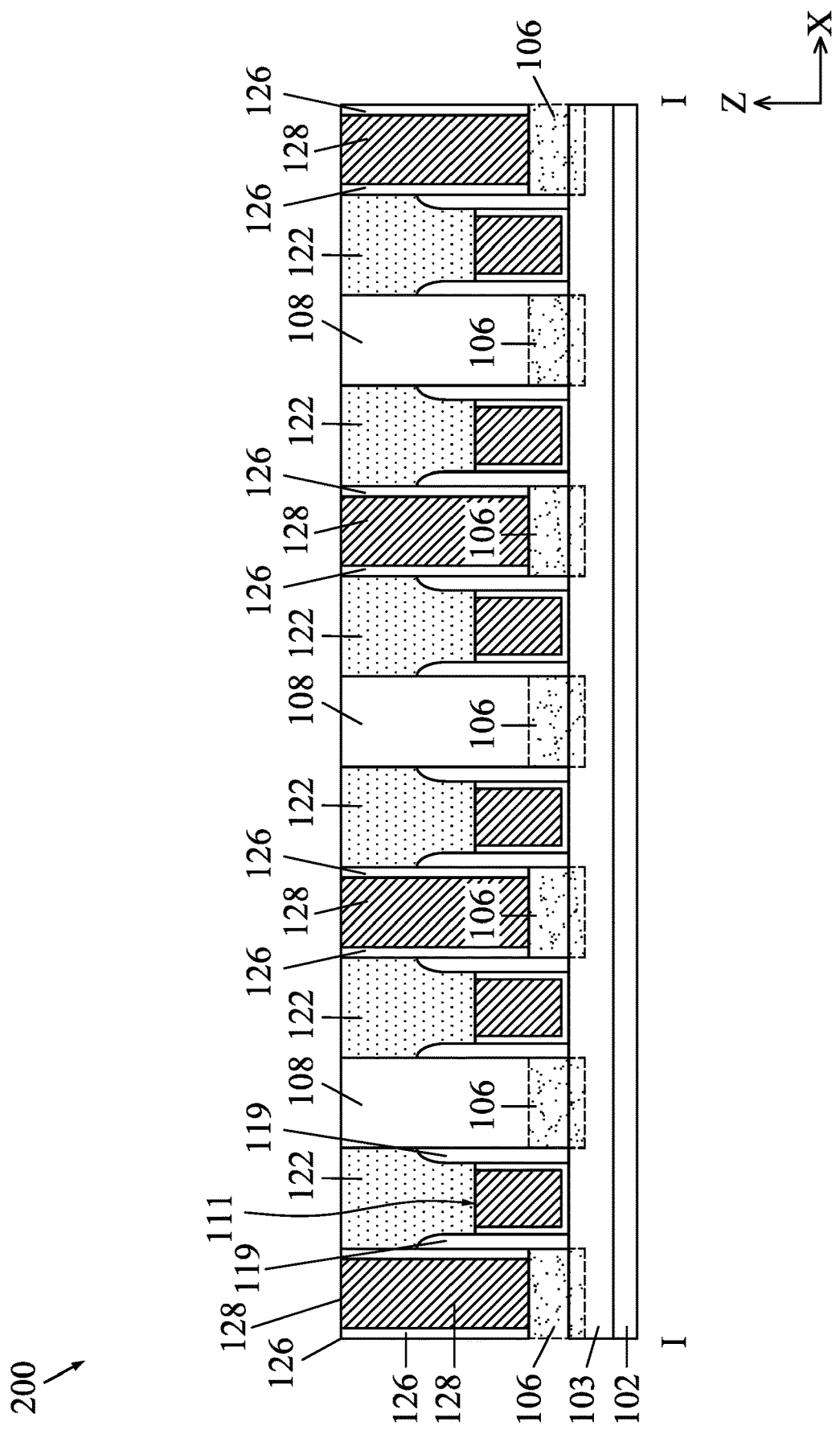
Figures 2, 2E:
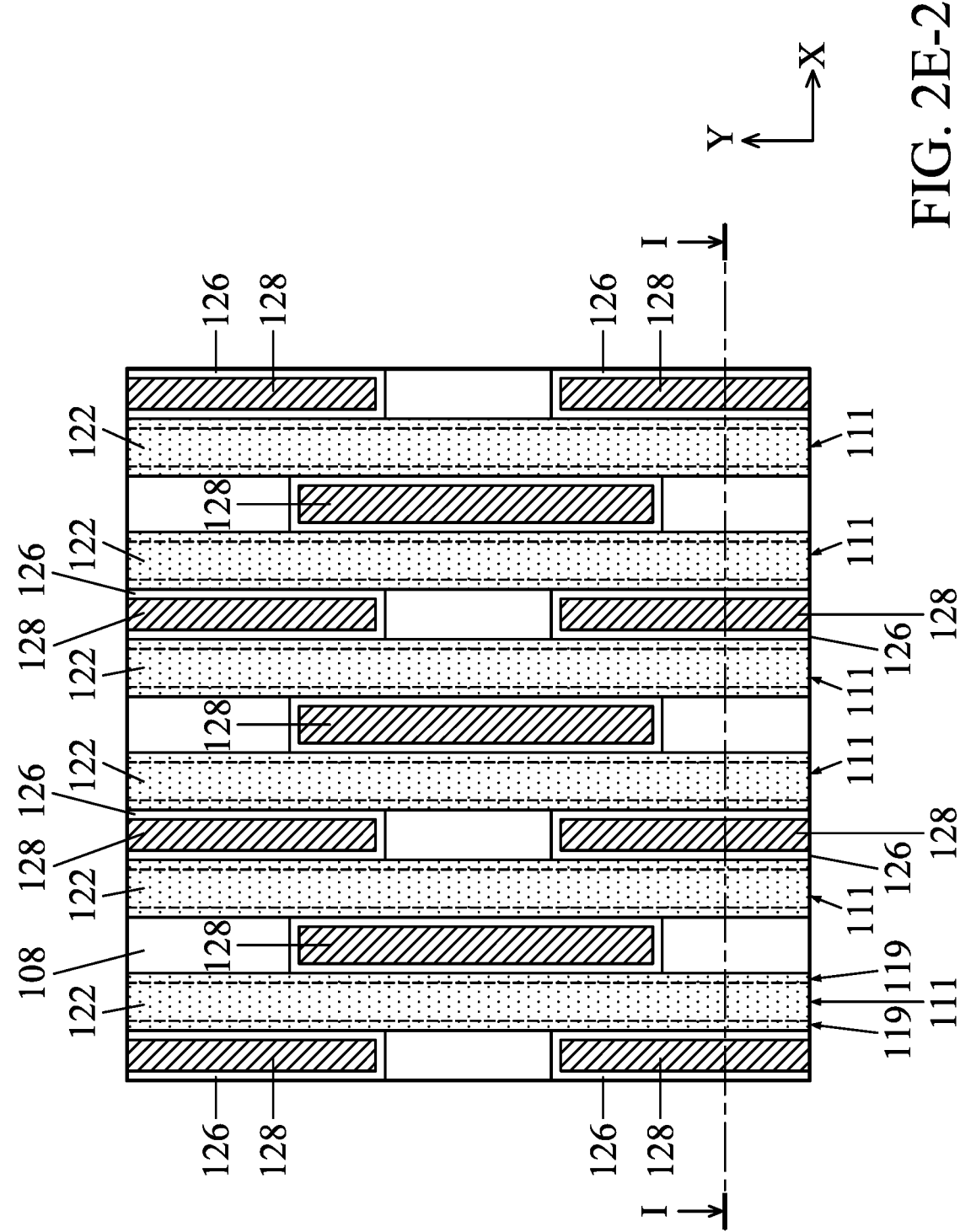
Figures 1, 2F:
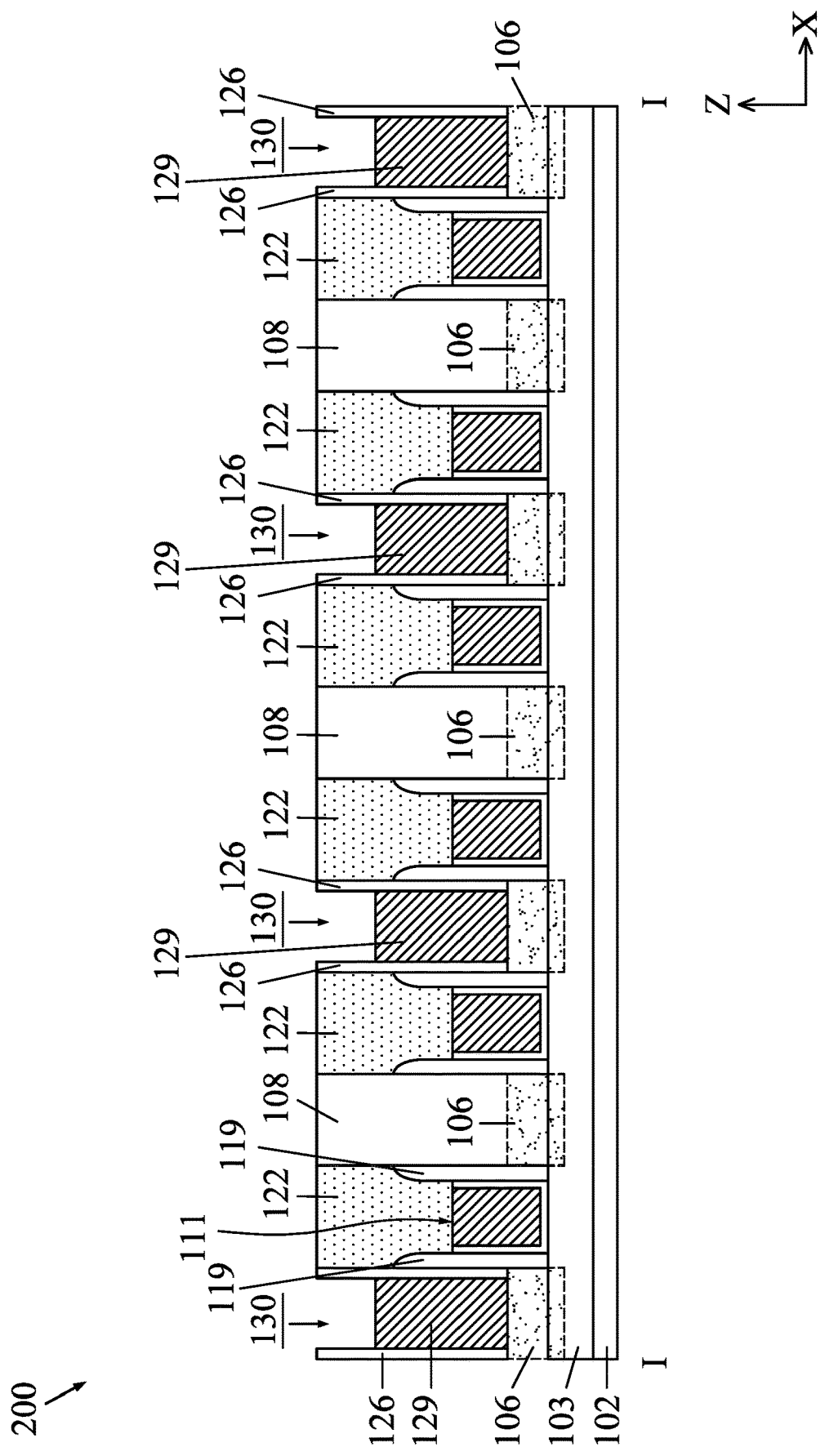
Figures 2, 2F:
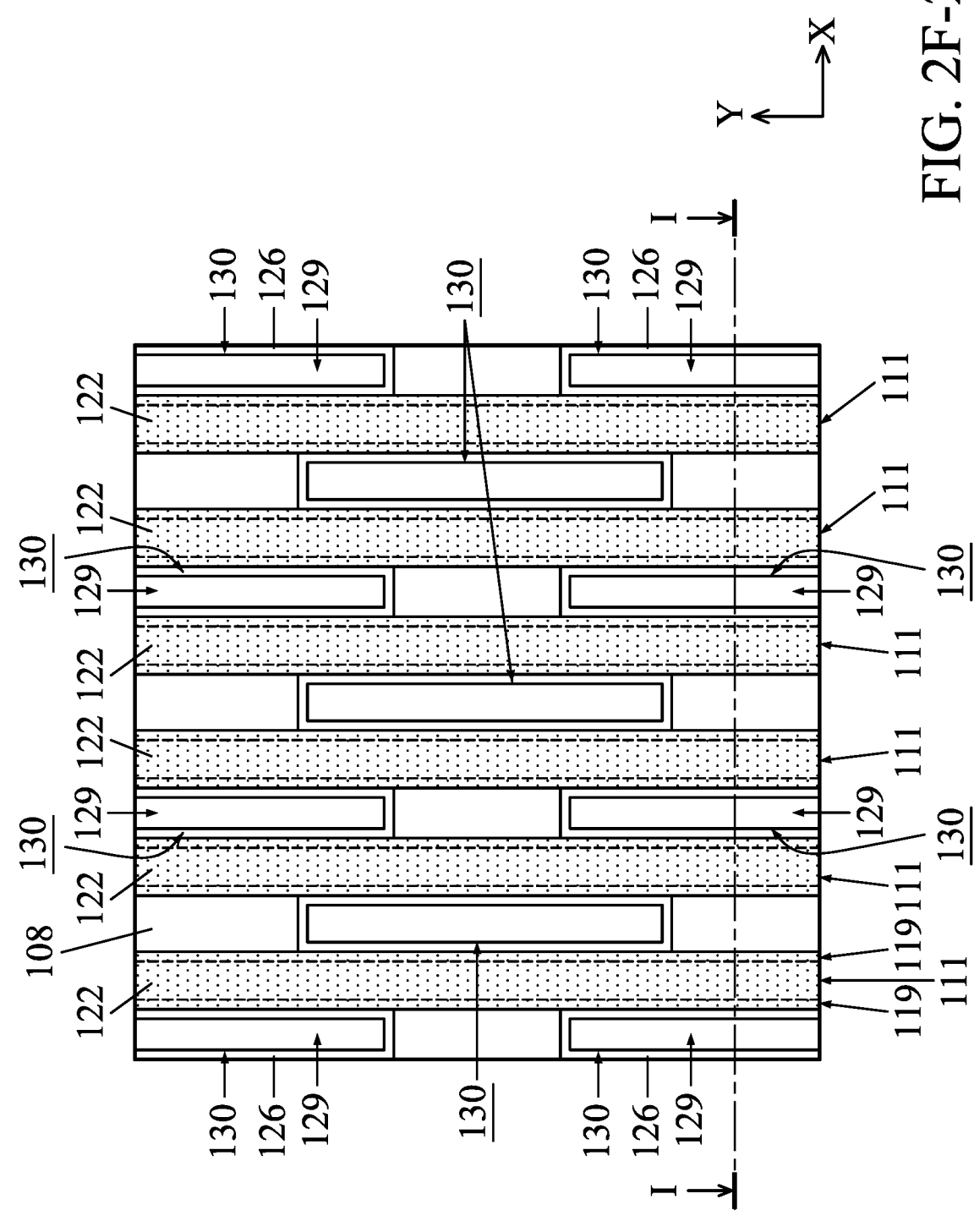
Figures 1, 2G:
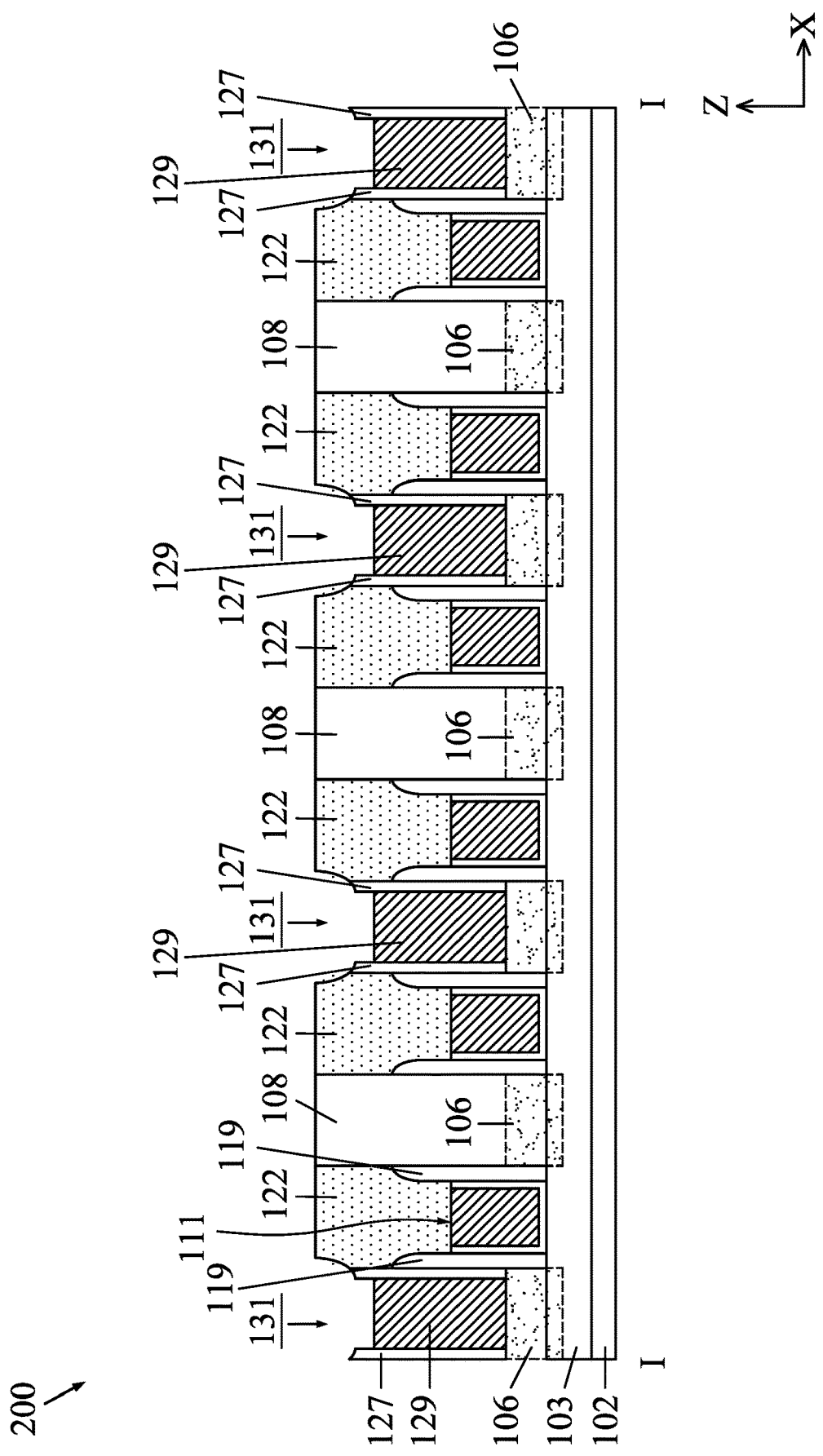
Figures 2, 2G:
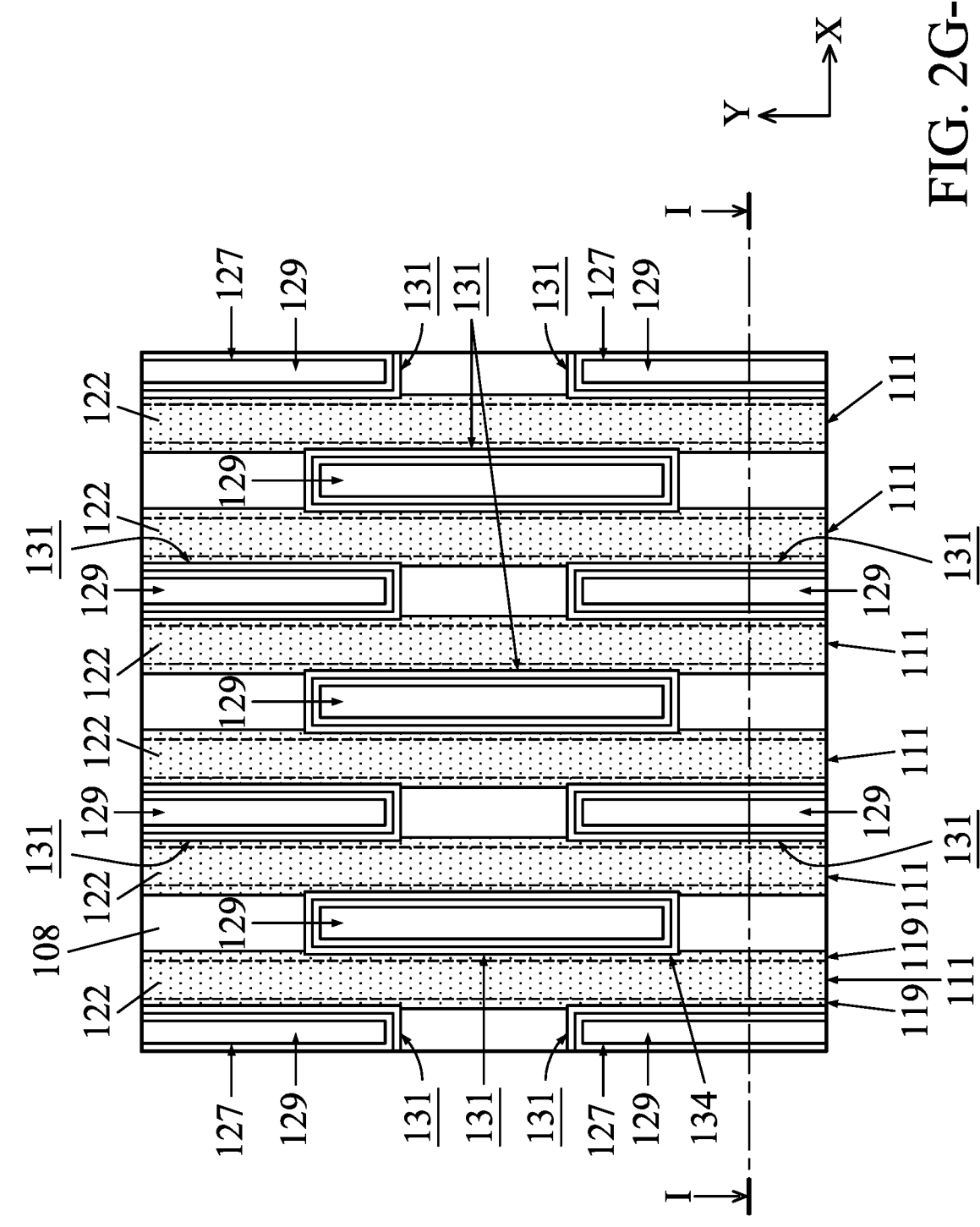
Figures 2, 2G, 3:
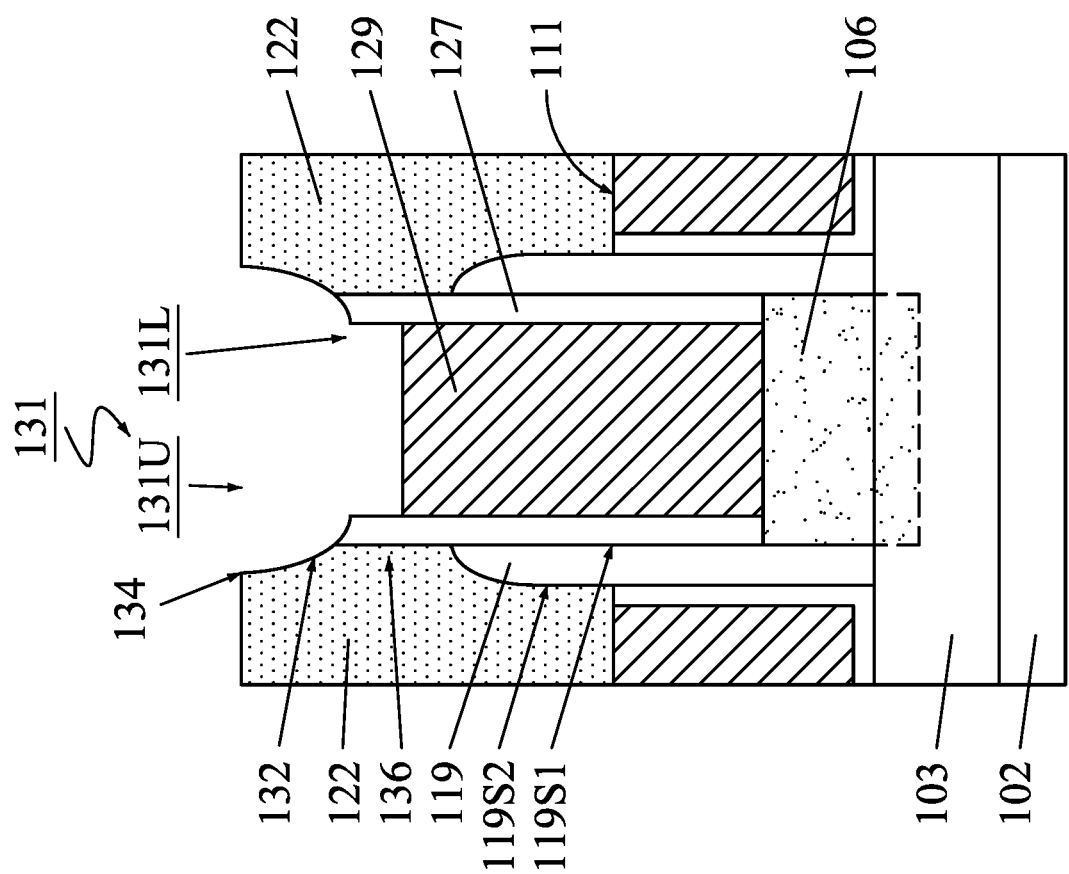
Figures 1, 2H:
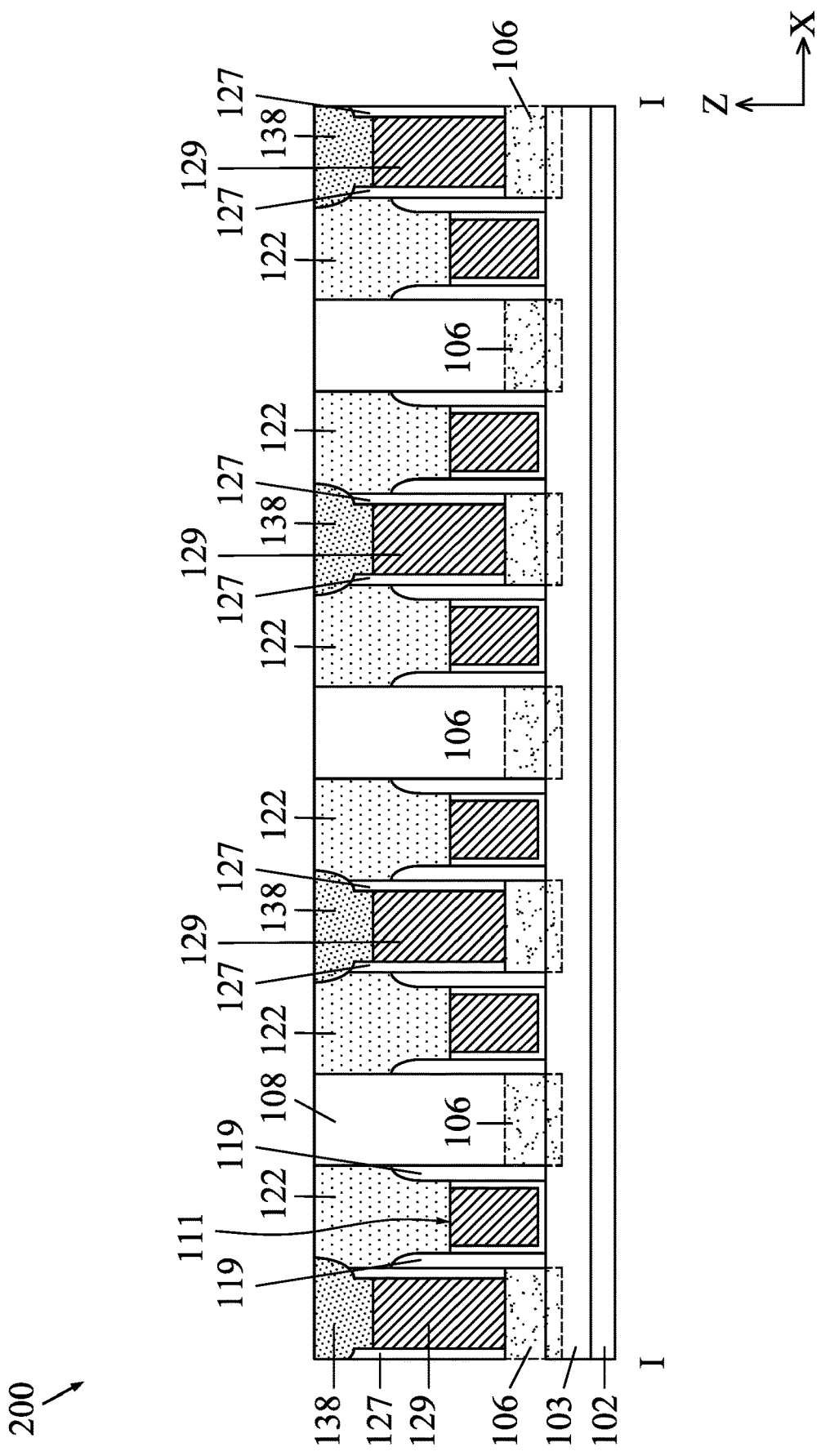
Figures 2, 2H:
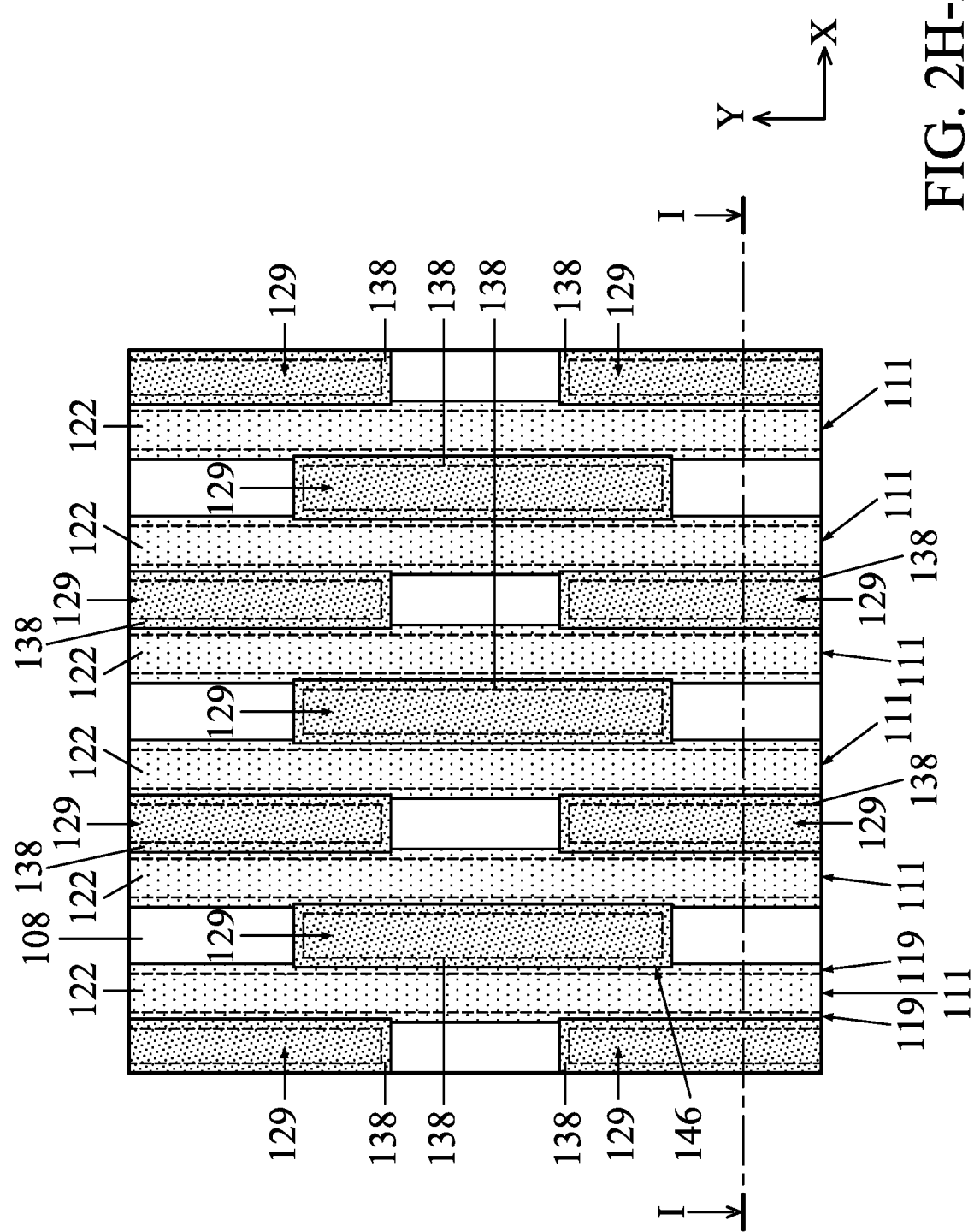
Figures 2, 2H, 3:
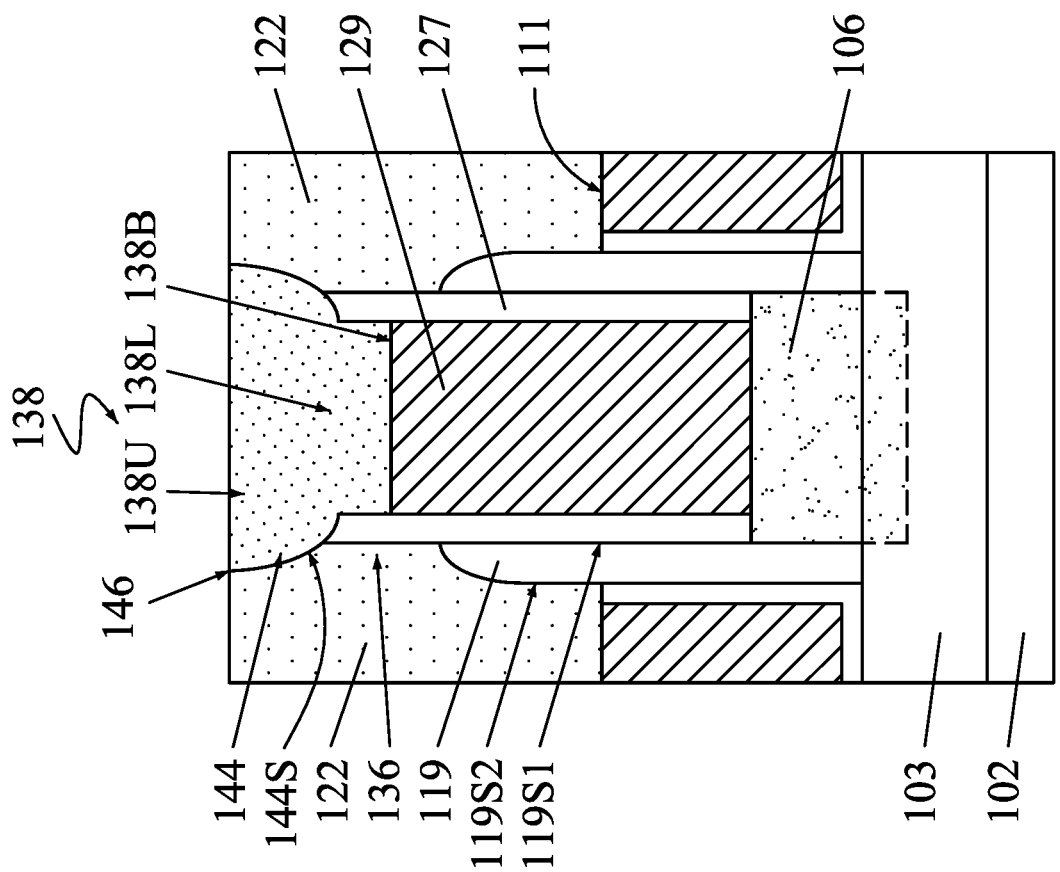
Figures 1, 2I:
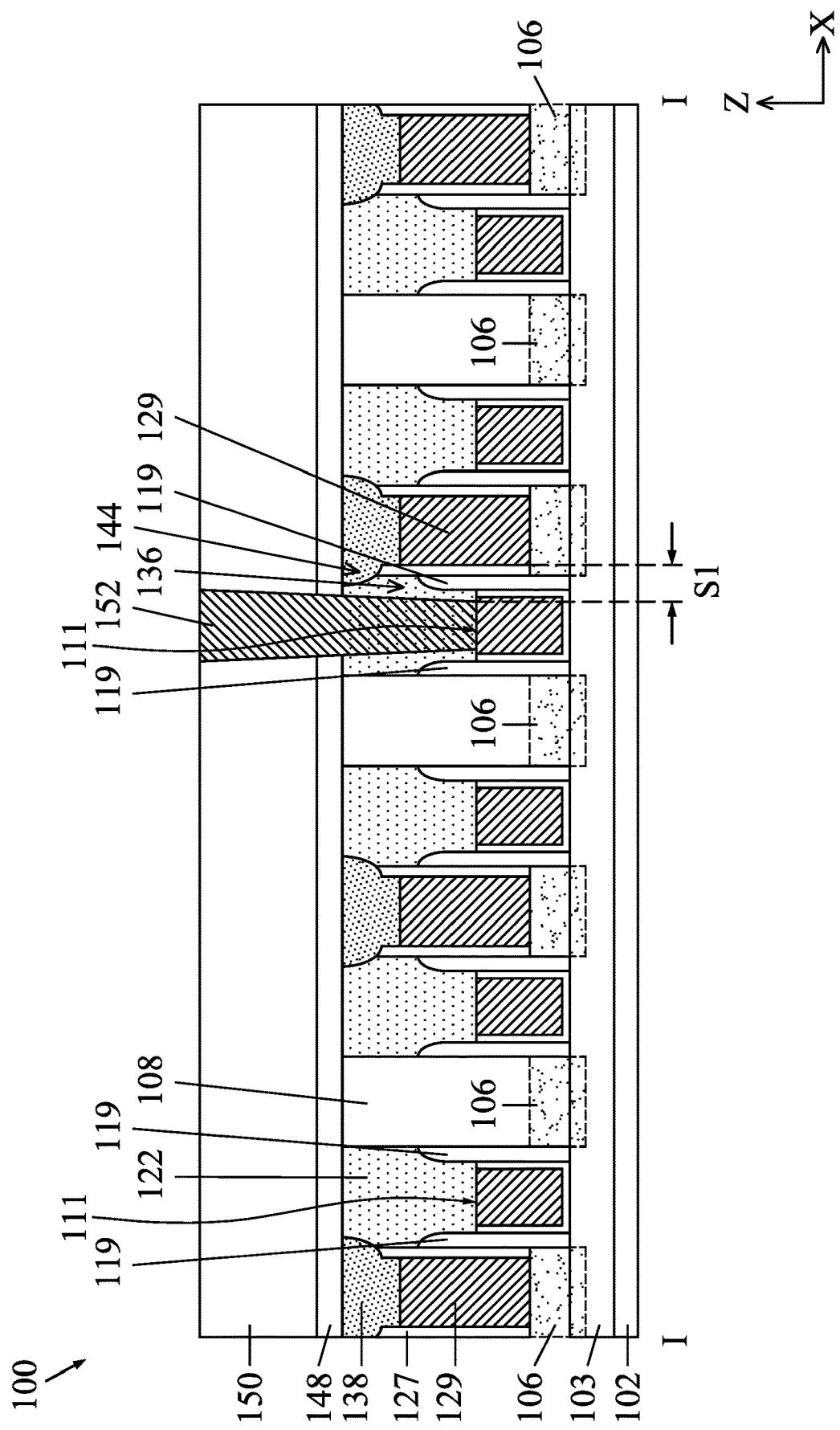
Figures 2, 2I:
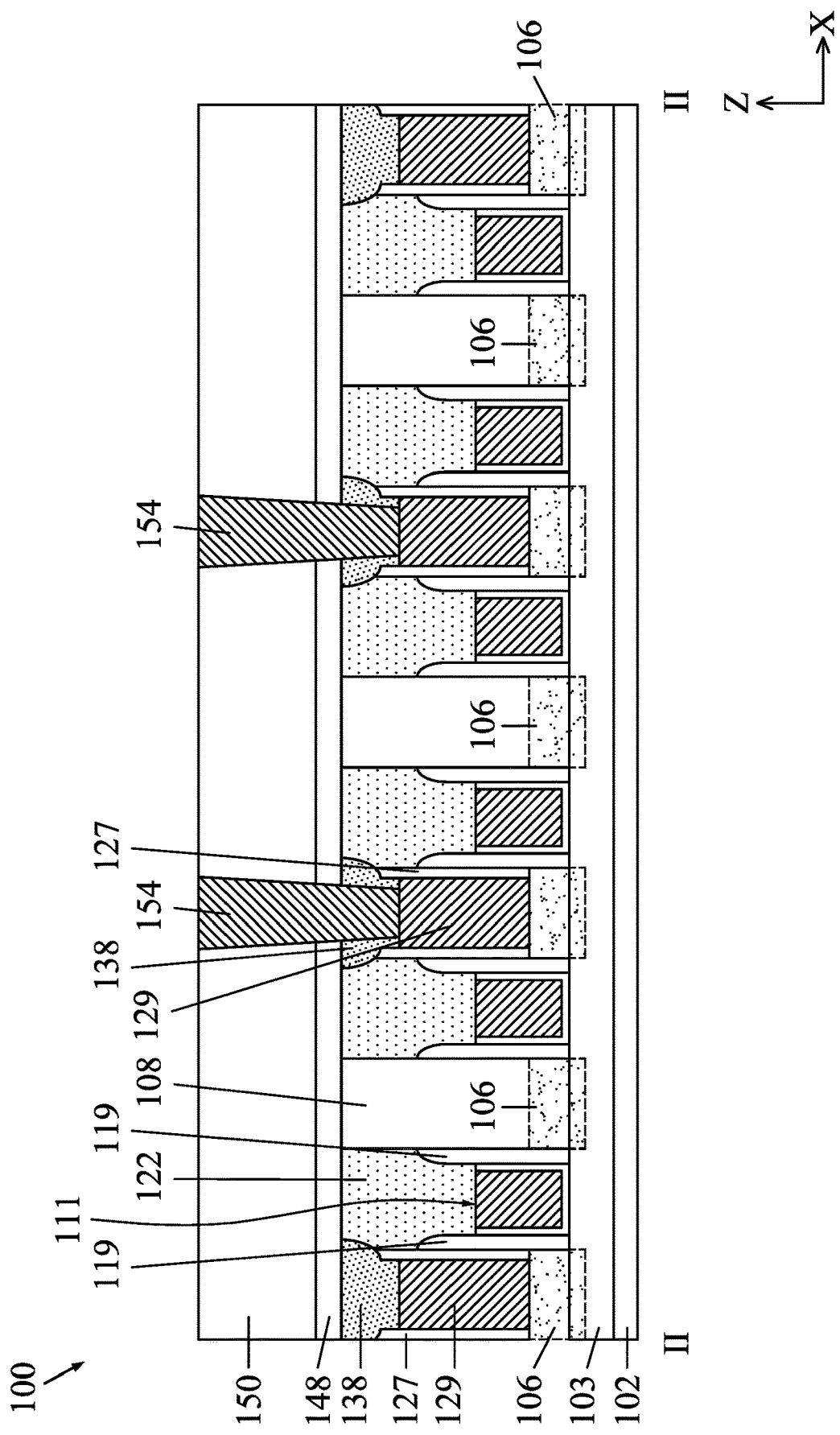
Figures 2, 2I, 3:
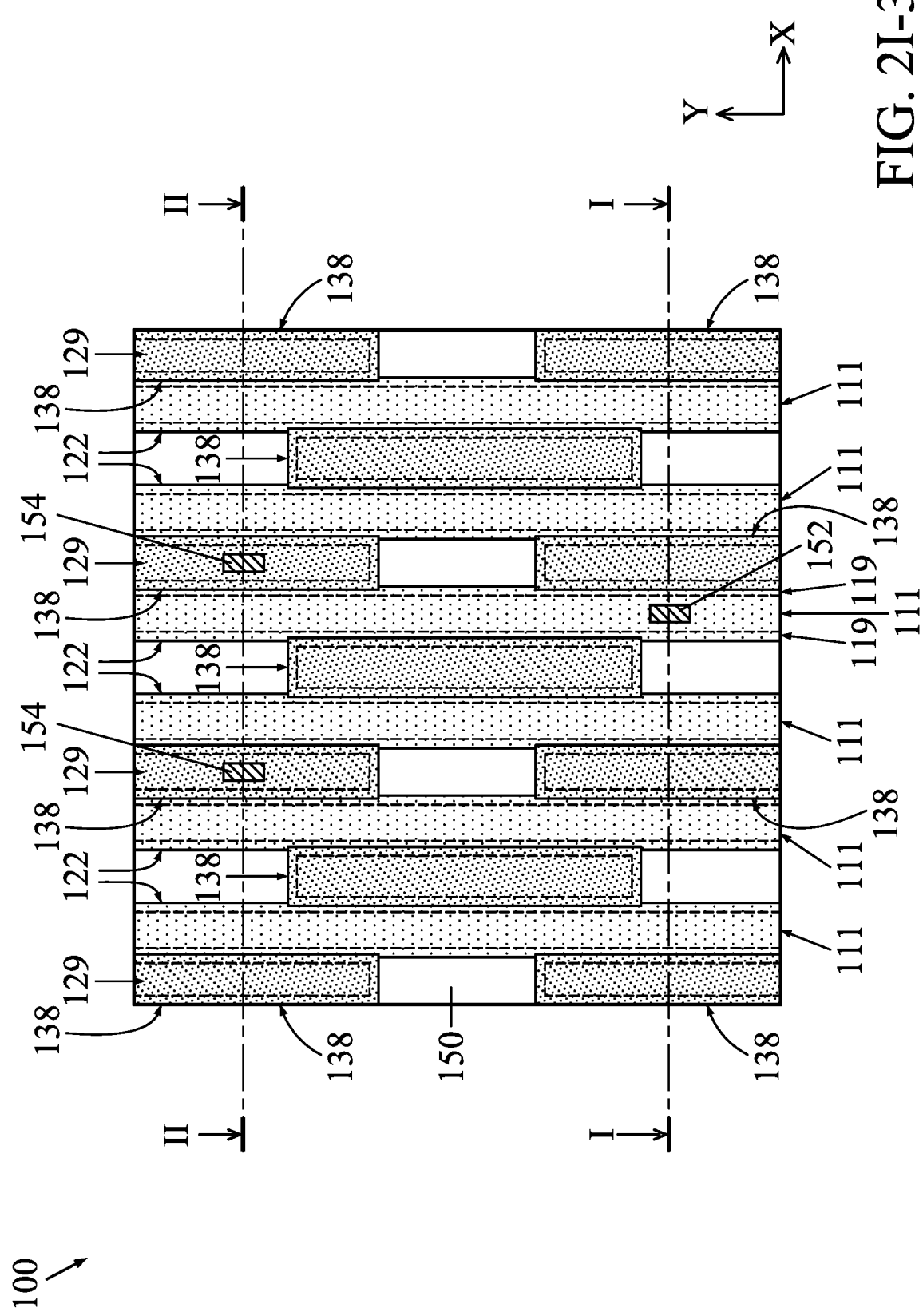

FIGS. 2A-1, 2B-1, 2C-1, 2D-1, 2E-1, 2F-1, 2G-1, 2H-1, 2I-1, and 2I-2 are cross-sectional views illustrating the formation of a semiconductor device at various intermediate stages, in accordance with some embodiments of the disclosure. FIGS. 2A-2, 2B-2, 2C-2, 2D-2, 2E-2, 2F-2, 2G-2, 2H-2, and 2I-3 are top views illustrating the formation of a semiconductor device at various intermediate stages, in accordance with some embodiments of the disclosure. FIGS. 2A-1, 2B-1, 2C-1, 2D-1, 2E-1, 2F-1, 2G-1, 2H-1, and 2I-1 are taken along line I-I in FIGS. 2A-2, 2B-2, 2C-2, 2D-2, 2E-2, 2F-2, 2G-2, 2H-2, and 2I-3, respectively. FIG. 2I-2 is taken along line II-II in FIG. 2I-3.

A semiconductor device structure 200 is provided, as shown in FIGS. 2A-1 and 2A-2, in accordance with some embodiments. The semiconductor device structure 200 is similar to the semiconductor device structure 100 of FIG. 1. FIG. 2A-1 also shows an interfacial layer 112 of the gate stack 110 formed on the fin structure 104, in accordance with some embodiments.

The gate spacer layers 118 and the gate stacks 110 are recessed to form trenches 120, as shown in FIGS. 2B-1 and 2B-2, in accordance with some embodiments. The recessing process may include one or more etching processes, such as dry etching and/or wet etching. The recessed gate spacer layers 118 and the recessed gate stacks 110 are denoted as gate spacer layers 119 and gate stacks 111, respectively, in accordance with some embodiments. The gate spacer layer 119 has an inner sidewall facing the gate stack 111 and an outer sidewall facing away from the gate stack 111, in accordance with some embodiments. In some embodiments, the inner sidewall or the gate spacer layer 119 has a curved upper portion that is connected to the outer sidewall of the gate spacer layer 119.

The top of the gate spacer layer 119 is higher than the upper surface of the gate stack 111, in accordance with some embodiments. As such, the trench 120 has an upper portion above the top of the gate spacer layer 119 and a lower portion between the gate spacer layer 119, and the upper portion is wider than the lower portion, in accordance with some embodiments.

The trenches 120 are filled with first mask layers 122, as shown in FIGS. 2C-1 and 2C-2, in accordance with some embodiments. Each first mask layer 122 is formed directly above and covers a single gate stack 111 and two neighboring gate spacer layers 119, in accordance with some embodiments. In some embodiments, the upper surface of the first mask layer 122 is substantially coplanar with the upper surface of the lower ILD layer 108. The first mask layer 122 has an upper portion above the top of the gate spacer layer 119 and a lower portion between the gate spacer layer 119, and the upper portion is wider than the lower portion, in accordance with some embodiments. In some embodiments, the first mask layer 122 has outermost sidewalls (or edges) that are substantially aligned with the opposite outer sidewalls of two gate spacer layers 119 facing away from the gate stack 111.

In some embodiments, the first mask layers 122 are made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO); or undoped silicon (Si). In some embodiments, the formation of the first mask layers 122 includes depositing an insulating material for the first mask layers 122 in the trenches 120 and over the upper surface of the lower ILD layer 108. In some embodiments, the deposition process may be CVD (such as HDP-CVD, PECVD, or HARP), ALD, another suitable method, and/or a combination thereof. In some embodiments, afterward, the insulating material over the upper surface of the lower ILD layer 108 is removed using such as CMP or etching-back process until the upper surface of the lower ILD layer 108 is exposed.

Portions of the lower ILD layer 108 formed directly above the source/drain features 106 are removed to form contact openings 124, as shown in FIGS. 2D-1 and 2D-2, in accordance with some embodiments. It is noted that the source/drain features 106 are located behind the cross-section view of FIG. 2D-1 and depicted by dashed lines. The contact openings 124 expose the upper surfaces of the source/drain features 106, in accordance with some embodiments. The contact openings 124 also expose portions of the outermost sidewalls of the first mask layers 122, in accordance with some embodiments. The contact openings 124 also expose portions of the outer sidewalls of the gate spacer layers 119 facing away from the gate stacks 111, in accordance with some embodiments. The contact openings 124 has a dimension may be less than the dimension of source/drain features 106, as measured in the Y direction.

The removal process may include forming a patterned mask layer (such as photoresist layer and/or hard mask layer, not shown) on the lower ILD layer 108 and the first mask layer 122. The patterned mask layer may have patterns (e.g., openings) corresponding to the contact openings 124. The portions of the lower ILD layer 108 exposed from the openings of the patterned mask layer may be etched away. The etch processes may include a reactive ion etch (RIE), neutral beam etch (NBE), inductive coupled plasma (ICP) etch, the like, or a combination thereof. The etch processes may be anisotropic. Afterward, the patterned mask layer may be removed.

Contact liners 126 are conformally formed along the sidewalls of the contact openings 124, as shown in FIGS. 2E-1 and 2E-2, in accordance with some embodiments. That is, the contact liners 126 are conformally formed along the respective exposed sidewalls of the first mask layers 122, the gate spacer layers 119, and the lower ILD layer 108, in accordance with some embodiments. The contact openings 124 are partially filled by the contact liners 126, in accordance with some embodiments.

In some embodiments, the contact liners 126 are made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO); or undoped silicon (Si). In some embodiments, the formation of the contact liners 126 includes conformally depositing an insulating material for the contact liners 126 along the sidewalls and the bottom surface of the contact openings 124, the upper surface of the lower ILD layer 108, and the upper surface of the first mask layer 122. The deposition process may be CVD (such as HDP-CVD, PECVD, or HARP), ALD, another suitable method, and/or a combination thereof. Afterward, the insulating material along the bottom surface of the contact openings 124, the upper surface of the lower ILD layer 108, and the upper surface of the first mask layer 122 are removed using etching process such as an anisotropic etching. The etching process may be performed without a patterned mask layer.

Source/drain contacts 128 are formed in the remaining portions of the contact openings 124 and land on the source/drain features 106, as shown in FIGS. 2E-1 and 2E-2, in accordance with some embodiments. The source/drain contacts 128 are surrounded by the contact liners 126, in accordance with some embodiments. The source/drain contacts 128 are formed alongside the gate stacks 111, the gate spacer layers 119, the first mask layers 122, and the lower ILD layer 108, in accordance with some embodiments. The source/drain contact 128 has an upper surface substantially coplanar with the upper surface of the contact liner 126, the upper surface of the lower ILD layer 108, and the upper surface of the first mask layer 122, in accordance with some embodiments.

In some embodiments, the source/drain contacts 128 are made of one or more conductive materials, for example, cobalt (Co), nickel (Ni), tungsten (W), titanium (Ti), tantalum (Ta), cupper (Cu), aluminum (Al), ruthenium (Ru), molybdenum (Mo), TiN, TaN, and/or a combination thereof. Each source/drain contact 128 may include a silicide layer, such as WSi, NiSi, TiSi or CoSi, formed on the exposed upper surface of the source/drain feature 106.

In some embodiments, the formation of the source/drain contacts 128 includes depositing a conductive material for source/drain contacts 128 in the contact openings 124 and over the upper surface of the lower ILD layer 108 and the upper surfaces of the first mask layers 122. In some embodiments, the conductive material is deposited using CVD, PVD, e-beam evaporation, ALD, electroplating (ECP), electroless deposition (ELD), another suitable method, or a combination thereof. In some embodiments, a planarization process such as CMP is performed on the conductive material until the upper surface of the lower ILD layer 108 and the upper surfaces of the first mask layer 122 are exposed.

The source/drain contacts 128 may have a multi-layer structure including, for example, liner layers, seed layers, adhesion layers, barrier layers, and the like. In some embodiments, the conductive material for the source/drain contacts 128 is formed using a selective deposition technique such as cyclic CVD process or ELD process, and therefore it is not necessary to form glue layer in the contact opening 124 before depositing the conductive material. In some embodiments, if the conductive material for the source/drain contacts 128 does not easily diffuse into the dielectric material (such as the ILD layer 108 and the first mask layers 122), the barrier layer may be omitted.

The source/drain contacts 128 are recessed to form recesses 130, as shown in FIGS. 2F-1 and 2F-2, in accordance with some embodiments. The recessing process may include an etching process, such as dry etching or wet etching. The recessed source/drain contacts 128 are denoted as source/drain contacts 129, in accordance with some embodiments. The recesses 130 expose upper portions of the inner sidewalls of the contact liners 126 facing the source/drain contacts 129, in accordance with some embodiments. In some embodiments, the exposed upper surface of the source/drain contact 129 (i.e., the bottom surface of the recess 130) is located at a higher level than the top (or the upper surface) of the gate spacer layer 119, in accordance with some embodiments.

An etching process is performed on the semiconductor device structure 200 to laterally enlarge the recesses 130, in accordance with some embodiments. The enlarged recesses 130 are denoted as recesses 131, as shown in FIGS. 2G-1 and 2G-2, in accordance with some embodiments. The etching process is an isotropic etching process, in accordance with some embodiments. For example, the etching process may be a wet etching or a dry chemical etching without the need for a lithography step. That is, in some embodiments, no patterned masking element formed above the lower ILD layer 108 and the first mask layers 122 is used in the etching process. The contact liners 126 and the first mask layer 122 are laterally etched from the recesses 130 during the etching process, in accordance with some embodiments. The recesses 131 pass through upper portions of the contact liners 126, in accordance with some embodiments. The recesses 131 extend into the first mask layers 122 from the outermost sidewalls of the first mask layers 122 facing the source/drain contacts 129, in accordance with some embodiments. The recessed contact liners 126 are denoted as contact liners 127, in accordance with some embodiments. In some embodiments, the source/drain contacts 129 are substantially not further recessed during the etching process.

In some embodiments, before the etching process for enlarging the recesses 130, a patterned mask layer having openings corresponding to the recesses 131 is formed over the semiconductor structure 200. The etching process may be performed using the patterned mask layer.

FIG. 2G-3 is a portion of the cross-sectional view of FIG. 2G-1, in accordance with some embodiments. The recess 131 has an upper portion 131U and a lower portion 131L, as shown in FIG. 2G-3, in accordance with some embodiments.

The upper portion 131U is located above the contact liners 127, and the lower portion 131L is located between the contact liners 127, in accordance with some embodiments. The upper portion 131U is wider than the source/drain contact 129 and has an upwardly increasing width, in accordance with some embodiments. The lower portion 131L and the source/drain contact 129 are substantially equal in width, in accordance with some embodiments. Laterally recessing the upper portions of the contact liner 126 and the first mask layer 122 creates a concave surface on the first mask layer 122 and a protruding portion 136 of the first mask layer 122 directly below the concave surface of the first mask layer 122, in accordance with some embodiments.

Furthermore, the upper portion 131U of the recess 131 has a sidewall 132 (i.e., the concave surface of the first mask layer) with a convex profile, as shown in FIG. 2G-3, in accordance with some embodiments. The sidewall 132 extends from an edge 134 of the recess 131 to the lower portion 131L, in accordance with some embodiments. In some embodiments, the convex profile of the sidewall 132 is nonlinear (e.g., curved). As a result, the recess 131 has a bowl shape, in accordance with some embodiments.

Furthermore, the recess 131 passes by above the outer sidewall 119S1 of the gate spacer layer 119 (facing away from the gate stack 111), as shown in FIG. 2G-3, in accordance with some embodiments. That is, the edge 134 of the recess 131 is located within the area of the gate spacer layer 119 when viewed from the top view of FIG. 2G-2, in accordance with some embodiments.

The trenches 131 are filled with second mask layers 138, as shown in FIGS. 2H-1 and 2H-2, in accordance with some embodiments. Each second mask layer 138 is formed directly above and covers a single source/drain contact 129 and two neighboring contact liners 127, in accordance with some embodiments. The second mask layer 138 also partially covers the first mask layer 122, in accordance with some embodiments. The second mask layer 138 interfaces the first mask layer 122 at the concave surface of the first mask layer 122, in accordance with some embodiments. The second mask layer 138 interfaces the source/drain contact 129 and the contact liner 127, in accordance with some embodiments. The upper surface of the second mask layer 138 is substantially coplanar with the upper surface of the first mask layer 122 and the lower ILD layer 108, in accordance with some embodiments.

FIG. 2H-3 is a portion of the cross-sectional view of FIG. 2H-1, in accordance with some embodiments. The second mask layer 138 has an upper portion 138U and a lower portion 138L, as shown in FIG. 2H-3, in accordance with some embodiments. The upper portion 138U is located above the contact liners 127, and the lower portion 138L is located between the contact liners 127, in accordance with some embodiments. The upper portion 138U is wider than the source/drain contact 129 and has an upwardly increasing width, in accordance with some embodiments. The lower portion 138L and the source/drain contact 129 are substantially equal in width, in accordance with some embodiments.

Furthermore, the upper portion 138U of the second mask layer 138 has a protruding portion 144, as shown in FIG. 2G-3, in accordance with some embodiments. The protruding portion 144 of the second mask layer 138 is located directly above and covers the protruding portion 136 of the first mask layer 122, in accordance with some embodiments. The protruding portion 144 of the second mask layer 138 has a surface 144S with a convex profile, in accordance with some embodiments. The convex surface 144S of the second mask layer 138 is mated with the concave surface of the first mask layer, in accordance with some embodiments. The surface 144S extends from an edge 146 of the second mask layer 138 to the lower portion 138L, in accordance with some embodiments. In some embodiments, the convex profile of the surface 144S is nonlinear (e.g., curved). As a result, the second mask layer 138 has a bowl shape, in accordance with some embodiments.

Furthermore, the protruding portion 144 of the second mask layer 138 passes by above the outer sidewall 119S1 of the gate spacer layers 119 (facing away from the gate stack 111), as shown in FIG. 2G-3, in accordance with some embodiments. That is, the edge 146 of the second mask layer 138 is located within the area of the gate spacer layer 119 when viewed from the top view of FIG. 2H-2, in accordance with some embodiments.

Furthermore, the lower portion 138L of the second mask layer 138 extends downwardly between the contact liners 127, in accordance with some embodiments. In some embodiments, the bottom surface 138B of the second mask layer 138 is located at a level equal to or higher than the top of the gate spacer layer 119. In some embodiments, the higher the level of the bottom surface 138B of the second mask layer 138 (i.e., the higher the level of the upper surface of the source/drain contact 129) the shorter the source/drain via formed subsequently, thereby reducing the resistance of the subsequently formed source/drain via.

In some embodiments, the protruding portion 144 of the second mask layer 138 is used to protect the protruding portion 136 of the first mask layer 122 during the following etching process. In some embodiments, the second mask layers 138 are made of a different insulating material than the first mask layer 122, in particular, an insulating material having a different etching selectivity than the first mask layer 122. In some embodiments, the second mask layer 138 are made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO); or undoped silicon (Si). In some embodiments, the formation of the second mask layer 138 includes depositing an insulating material for the second mask layer 138 in the trenches 131 and over the upper surface of the lower ILD layer 108 and the upper surfaces of the first mask layers 122. In some embodiments, the deposition process may be CVD (such as HDP-CVD, PECVD, or HARP), ALD, another suitable method, and/or a combination thereof. In some embodiments, afterward, the insulating material over the upper surface of the lower ILD layer 108 is removed using such as CMP or etching-back process until the upper surface of the lower ILD layer 108 is exposed.

An etching stop layer 148 is formed over the upper surface of the lower ILD layer 108, the upper surfaces of the first mask layers 122, and the upper surfaces of the second mask layers 138, as shown in FIGS. 2I-1, 2I-2, and 2I-3, in accordance with some embodiments. In some embodiments, the etching stop layer 148 is made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO); or undoped silicon (Si). In some embodiments, the etching stop layer 148 is formed using CVD (such as LPCVD, PECVD, HDP-CVD, HARP, and FCVD), ALD, another suitable method, or a combination thereof.

An upper ILD layer 150 is formed over the etching stop layer 148, as shown in FIGS. 2I-1, 2I-2, and 2I-3, in accordance with some embodiments. In some embodiments, the upper ILD layer 150 is made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO); or undoped silicon (Si). In some embodiments, the upper ILD layer 150 is made of SiO-based material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the upper ILD layer 150 is formed using CVD (such as LPCVD, PECVD, HDP-CVD, HARP, and FCVD), ALD, another suitable method, or a combination thereof.

Gate via 152 is formed through the upper ILD layer 150, the etching stop layer 148, and the first mask layer 122 and lands on the gate stack 111, as shown in FIGS. 2I-1 and 2I-3, in accordance with some embodiments. Source/drain vias 154 are formed through the upper ILD layer 150, the etching stop layer 148, and the second mask layer 138s and land on the source/drain contacts 129, as shown in FIGS. 2I-2 and 2I-3, in accordance with some embodiments. After the gate via 152 and the source/drain via 154 are formed, a semiconductor device is produced.

In some embodiments, the formation of the gate via 152 includes patterning the upper ILD layer 150, the etching stop layer 148, and the first mask layer 122 to form a via hole exposing the gate stack 111. In some embodiments, the formation of the source/drain via 154 includes patterning the upper ILD layer 150, the etching stop layer 148, and the second mask layer 138 to form a via hole exposing the source/drain contact 129. In some embodiments, the steps of forming the via holes the gate via 152 and the source/drain via 154 includes forming a patterned mask layer (not shown) on the upper ILD layer 150, and etching the upper ILD layer 150, the etching stop layer 148, the first mask layer 122 and the second mask layer 138 uncovered by the patterned mask layer.

For example, a photoresist may be formed on the upper ILD layer 150, such as by using spin-on coating, and patterned with a pattern corresponding to the via holes by exposing the photoresist to light using an appropriate photomask. Exposed or unexposed portions of the photo resist may be removed depending on whether a positive or negative resist is used. The pattern of the photoresist may then be transferred to the upper ILD layer 150, the etching stop layer 148, the first mask layer 122 and the second mask layer 138, such as by using one or more suitable etch processes. The photoresist may be removed in an ashing or wet strip process, for example.

For example, a hard mask layer may be formed on the upper ILD layer 150. The hard mask layer may include, or be formed of, a nitrogen-free anti-reflection layer (NFARL), carbon-doped silicon dioxide (e.g., $SiO_2$:C), titanium nitride (TiN), titanium oxide (TiO), boron nitride (BN), a multilayer thereof, or another suitable material. The hard mask layer may be patterned using photolithography and etching processes described above to have a pattern corresponding to the via holes. The hard mask layer may transfer the pattern to the upper ILD layer 150, the etching stop layer 148, the first mask layer 122 and the second mask layer 138 to form the via holes which may be by using one or more suitable etch processes.

The etch processes may include a reactive ion etch (RIE), neutral beam etch (NBE), inductive coupled plasma (ICP) etch, the like, or a combination thereof. The etch processes may be anisotropic. Furthermore, the etching processes for forming the via hole of the gate via 152 and the via hole of the source/drain via 154 are performed separately, e.g., using different etchants, in accordance with some embodiments.

In some embodiments, the gate via 152 and the source/drain via 154 are made of one or more conductive materials, for example, cobalt (Co), nickel (Ni), tungsten (W), titanium (Ti), tantalum (Ta), cupper (Cu), aluminum (Al), ruthenium (Ru), molybdenum (Mo), TiN, TaN, and/or a combination thereof.

In some embodiments, one or more conductive materials for the gate via 152 and the source/drain via 154 fill the via holes and/or is formed over the upper surface of the upper ILD layer 150. In some embodiments, the one or more conductive materials are deposited using CVD, PVD, e-beam evaporation, ALD, ECP, ELD, another suitable method, or a combination thereof. In some embodiments, a planarization process such as CMP is performed on the one or more conductive materials until the upper surface of the upper ILD layer 150 is exposed.

The gate via 152 and the source/drain via 154 each may have a multi-layer structure including, for example, liner layers, seed layers, adhesion layers, barrier layers, and the like. In some embodiments, the conductive material for the gate via 152 and the source/drain via 154 is formed using a selective deposition technique such as cyclic CVD process or ELD process, and therefore it is not necessary to form glue layer in the via holes before depositing the conductive material. In some embodiments, if the conductive material for the gate via 152 and the source/drain via 154 does not easily diffuse into the dielectric material (such as the upper ILD layer 150, the etching stop layer 148, the first mask layers 122, and the second mask layer 138), the barrier layer may be omitted.

As the scale of the semiconductor devices continues to shrink, one of the design challenges of the semiconductor devices is to improve via-to-gate overlay window. The spacing Si is the distance between the gate via 152 and the source/drain contact 129, as measured in the X direction, as shown in FIG. 2I-1, in accordance with some embodiments. If the gate via 152 is too close to the source/drain contact 129 (i.e., the spacing Si is too small), the time-dependent dielectric breakdown (TDDB) of the semiconductor device may become worse.

The protruding portion 144 of the second mask layer 138 covers the protruding portion 136 of the first mask layer 122, and the second mask layer 138 is made of a material having a lower etching rate than the first mask layer 122 during the etching process for forming the gate via hole. As a result, the protruding portion 144 of the second mask layer 138 may protect the protruding portion 136 of the first mask layer 122 during the etching process for forming the gate via hole. After forming the via hole for the gate via 152, the protruding portion 136 of the first mask layer 122 remains between the gate via 152 and the source/drain contact 129, which may prevent the gate via 152 from being too close to the source/drain contact 129 (i.e., maintaining the greater spacing S1). Therefore, the via-to-gate overlay window and the TDDB window of the semiconductor device may be improved, which may enhance the reliability of the semiconductor device.

Figure 2J:
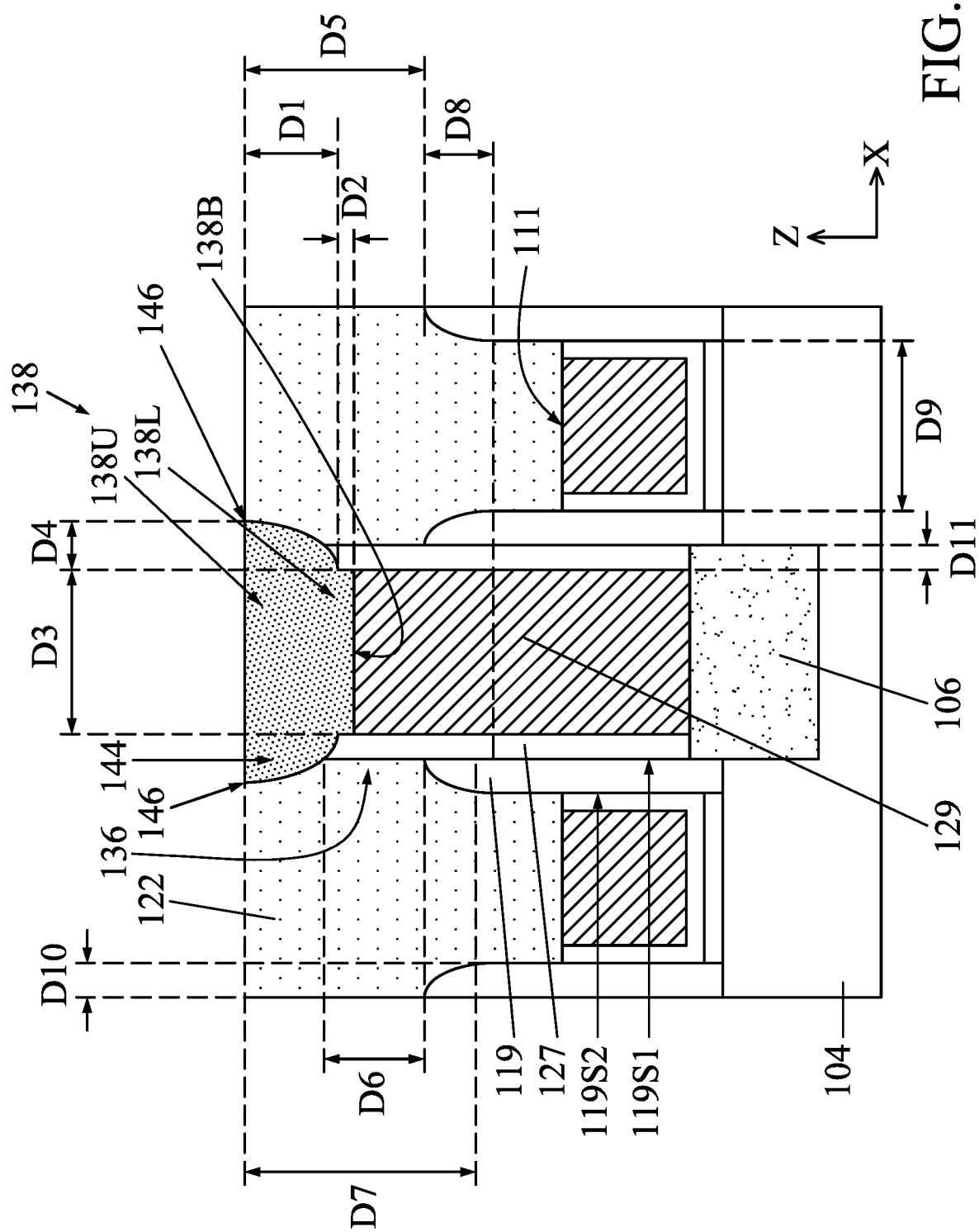
FIG. 2J is a cross-sectional view of a portion of a semiconductor device to illustrate the dimensions of some features of the semiconductor device, in accordance with some embodiments.
Figure 3:
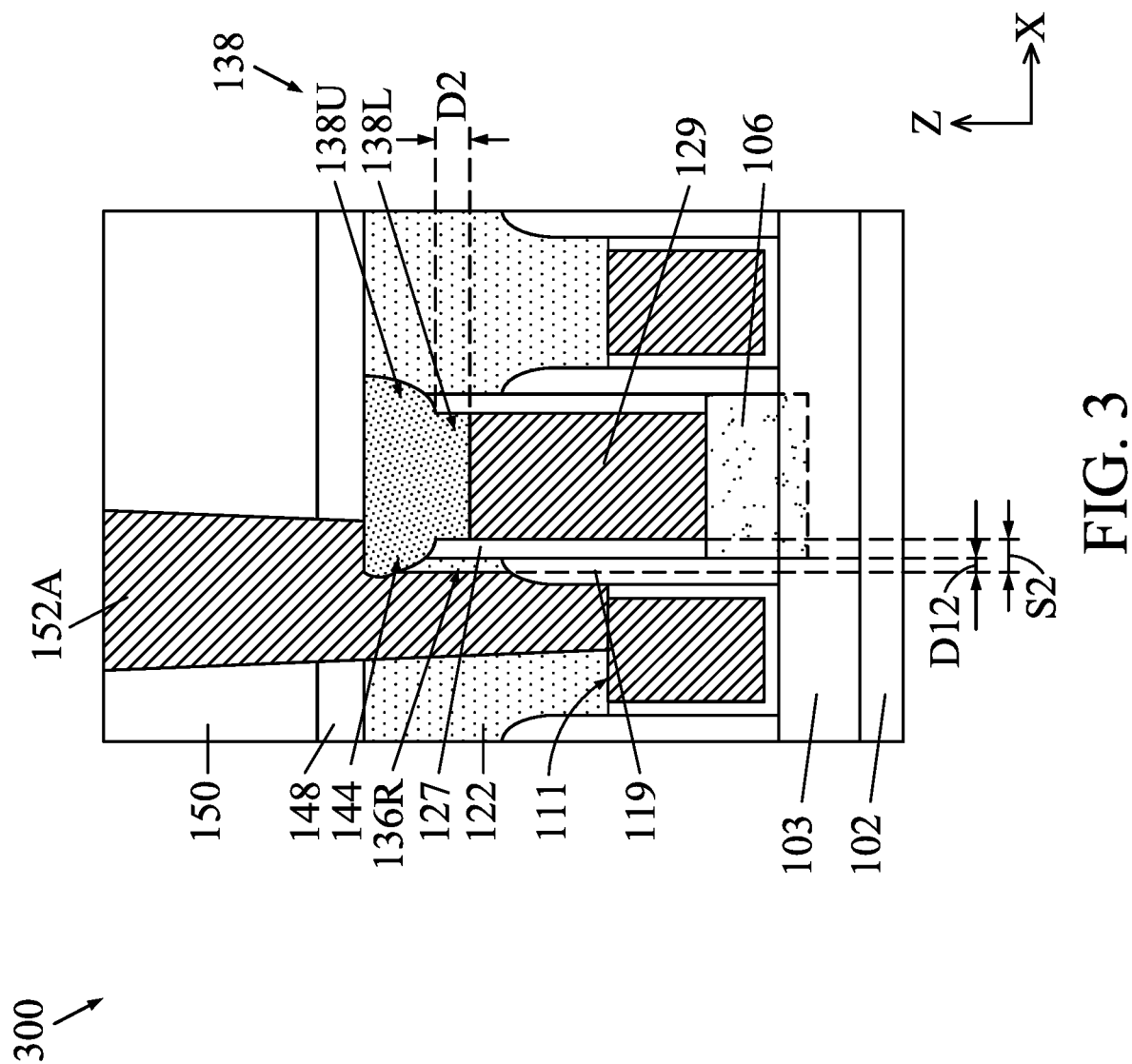

FIG. 2J is a cross-sectional view of a portion of the semiconductor device to illustrate the dimensions of some features of the semiconductor device. It is noted that the cross-sectional of FIG. 2J cuts through the source/drain feature 106 and the fin structure 104. In some embodiments, the upper portion 138U of the second mask layer 138 has a dimension D1 from the upper surface of the second mask layer 138 to the upper surface (or the lowest point of the upper surface) of the contact liner 127, as measured in the Z direction. In some embodiments, the dimension D1 is in the range from about 0.5 nm to about 40 nm.

In some embodiments, the lower portion 138L of the second mask layer 138 extends between the contact liners 127 by a dimension D2, as measured in the Z direction. In some embodiments, the dimension D2 is less than about 50 nm.

In some embodiments, the lower portion 138L of the second mask layer 138 has a dimension D3 along the upper surface of the source/drain contact 138, as measured in the X direction. In some embodiments, the dimension D3 is in the range from about 3 nm to about 50 nm.

In some embodiments, the protruding portion 144 of the second mask layer 138 extends from an extending plane of an inner sidewall of the source/drain contact 129 facing the source/drain contact 129 to the edge 146 of the second mask layer 138 by a dimension D4, as measured in the X direction. In some embodiments, the dimension D4 is in the range from about 0.5 nm to about 50 nm. The ratio of the dimension D4 to the dimension D3 is in a range from about 0.3 to about 9. If the ratio of the dimension D4 to the dimension D3 is too high, the landing area of the gate via 152 to gate stack 111 may be reduced. If the ratio of the dimension D4 to the dimension D3 is too low, the via-to-gate overlay window may be reduced because the second mask layer 138 may not sufficiently protect the first mask layer 122.

In some embodiments, the upper portion of the first mask layer 122 has a dimension D5 above the top of the gate spacer layer 119, as measured in the Z direction. In some embodiments, the dimension D5 is in the range from about 1 nm to about 40 nm.

In some embodiments, the protruding portion 136 of the first mask layer 122 has a dimension D6 along an outer sidewall of the contact liner 127 facing away from the source/drain contact 129, as measured in the Z direction. In some embodiments, the dimension D6 is less than about 50 nm.

In some embodiments, the first mask layer 122 has a dimension D7 from the edge 146 of the second mask layer 138 to the gate spacer layer 119, as measured in the Z direction. In some embodiments, the dimension D7 is less than 60 nm.

In some embodiments, the lower portion of the first mask layer 122 has a dimension D9 along the upper surface of the gate stack 111, as measured in the X direction. In some embodiments, the dimension D9 is in the range from about 3 nm to about 50 nm.

In some embodiments, the first mask layer 122 has a dimension D10 directly above the gate spacer layer 119, as measured in the X direction. In some embodiments, the dimension D10 is in the range from about 1 nm to about 40 nm.

In some embodiments, the gate spacer layer 119 has a dimension D8 from the top of the gate spacer layer 119 to the edge of the inner sidewall 119S2 of the gate spacer layer 119, as measured in the Z direction. In some embodiments, the dimension D8 is less than about 10 nm.

In some embodiments, the contact liner 127 has a dimension D11, as measured in the X direction. In some embodiments, the dimension D11 is less than about 30 nm.

FIG. 3 is a portion of a cross-sectional view of a semiconductor device 300 which is a modification of the semiconductor device 200 of FIG. 2I-1 in accordance with some embodiments. The semiconductor device 300 is similar to the semiconductor device 200 of FIG. 2I-1 except the gate via, in accordance with some embodiments.

The semiconductor device 300 includes a gate via 152A that is offset from the gate stack 111 and toward the source/drain contact 129, in accordance with some embodiments. The gate via 152A lands on a portion of the gate stack 111 and covers a portion of the second mask layer 138, in accordance with some embodiments.

In some embodiments, during forming the gate via 152A, a pattern (e.g., opening) of the patterned mask for forming the gate via 152A corresponds to a portion of the gate stack 111 and a portion of the source/drain contact 129. During the etching process for forming the via hole of the gate via 152, the via hole passes through the upper ILD layer 150, the etching stop layer 148, and the first mask layer 122 to expose a portion of the gate stack 111, in accordance with some embodiments. Because the etching rate of the second mask layer 138 is lower than the etching rate of the first mask layer 122 during the etching process, the via hole of the gate via 152 exposes and stops at the upper surface of the second mask layer 138, in accordance with some embodiments. As such, the via hole of the gate via 152 does not pass through the second mask layer 138 and does not extend to the source/drain contact 129.

The protruding portion 144 of the second mask layer 138 covers and protects the protruding portion 136 of the first mask layer 122, thereby preventing the protruding portion 136 from being entirely removed by the etching process. After the etching process, the first mask layer 122 has a remaining portion 136R between the gate via 152A and the contact liner 127. The remaining portion 136R may prevent the gate via 152 from being too close to the source/drain contact 129, and therefore the via-to-gate overlay window and the TDDB window of the semiconductor device may be improved, which may enhance the reliability of the semiconductor device. In some embodiments, the remaining portion 136R has a dimension D12 as measured in the X direction. In some embodiments, the dimension D12 is less than about 20 nm.

Furthermore, the remaining portion 136R of the first mask layer 122 may provide additional benefits. Because the remaining portion 136R between the gate via 152A and the contact liner 127 maintains the spacing S2 between the gate via 152A and the source/drain contact 129, the source/drain contact 129 may be formed to have a greater thickness. That is, the dimension D2 of the low portion 138L of the second mask layer 138 may be reduced, or alternatively, the second mask layer 138 does not have a low portion 138L. As a result, the source/drain via 154 (shown in FIG. 2I-2) landing on the source/drain contact 129 may be shorter, thereby reducing the resistance of the source/drain via 154.

Figure 4A:
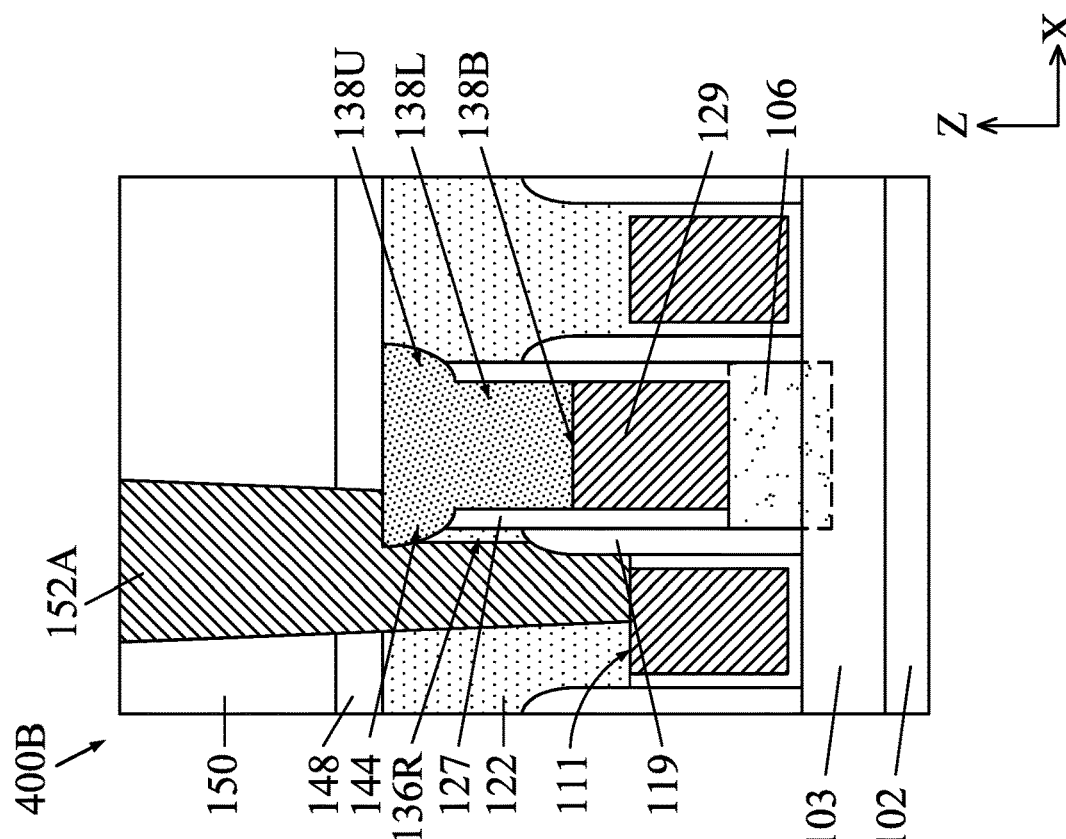

FIG. 4A is a portion of a cross-sectional view of a semiconductor device 400A which is a modification of the semiconductor device 200 of FIG. 2I-1, in accordance with some embodiments. The semiconductor device 400A is similar to the semiconductor device 200 of FIG. 2I-1 except for the second mask layer 138, in accordance with some embodiments. The lower portion 138L of the second mask layer 138 extends downwardly to a level that is below the top (or the upper surface) of the gate spacer layer 119, as shown in FIG. 4A-1, in accordance with some embodiments. That is, the bottom surface 138B of the second mask layer 138 is located at a level below the upper surface of the gate spacer layer 119, in accordance with some embodiments.

Figure 4B:
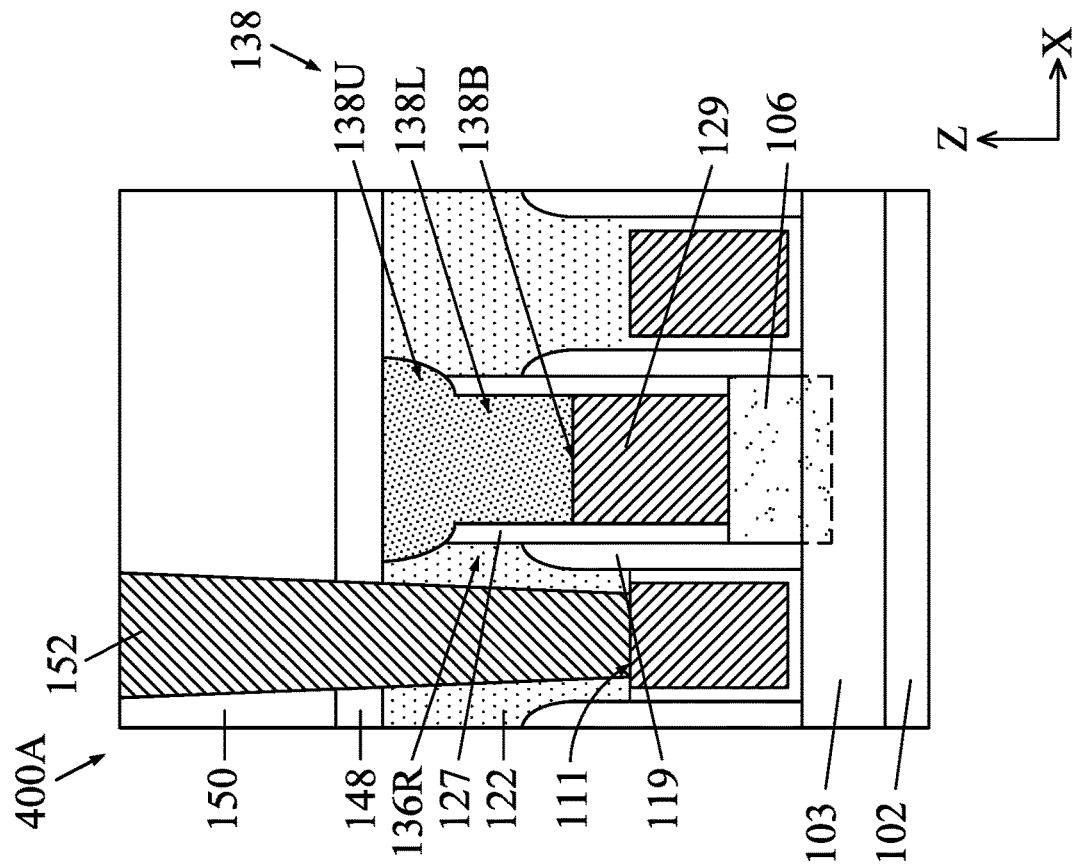

FIG. 4B is a portion of a cross-sectional view of a semiconductor device 400B which is a modification of the semiconductor device 400A of FIG. 4A, in accordance with some embodiments. The semiconductor device 400B is similar to the semiconductor device 400A of FIG. 4A except that the gate via 152A is offset toward the source/drain contact 129, as shown in FIG. 4B, in accordance with some embodiments. The gate via 152A lands on a portion of the gate stack 111 and covers a portion of the second mask layer 138, in accordance with some embodiments. Because the second mask layer 138 may protect the first mask layer 122 during the etching process for forming the gate via hole, the via-to-gate overlay window and the TDDB window of the semiconductor device may be improved, which may enhance the reliability of the semiconductor device.

Figure 4D:
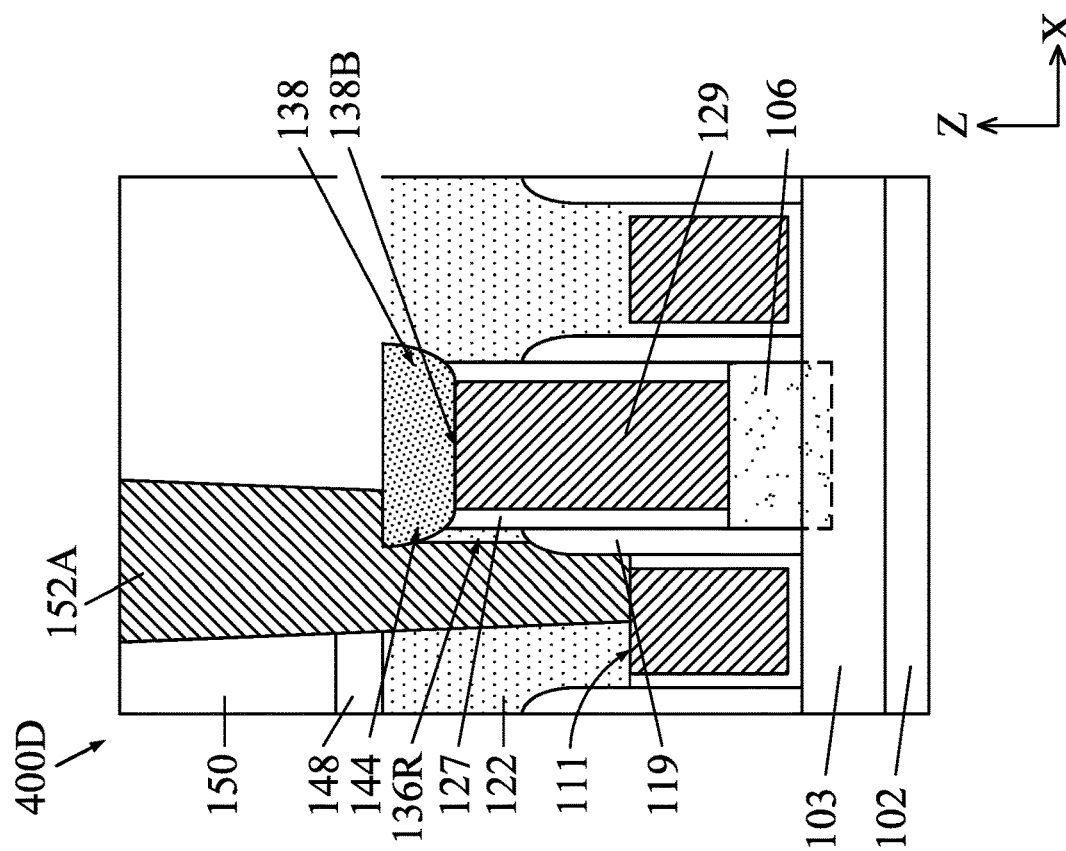
Figure 4C:
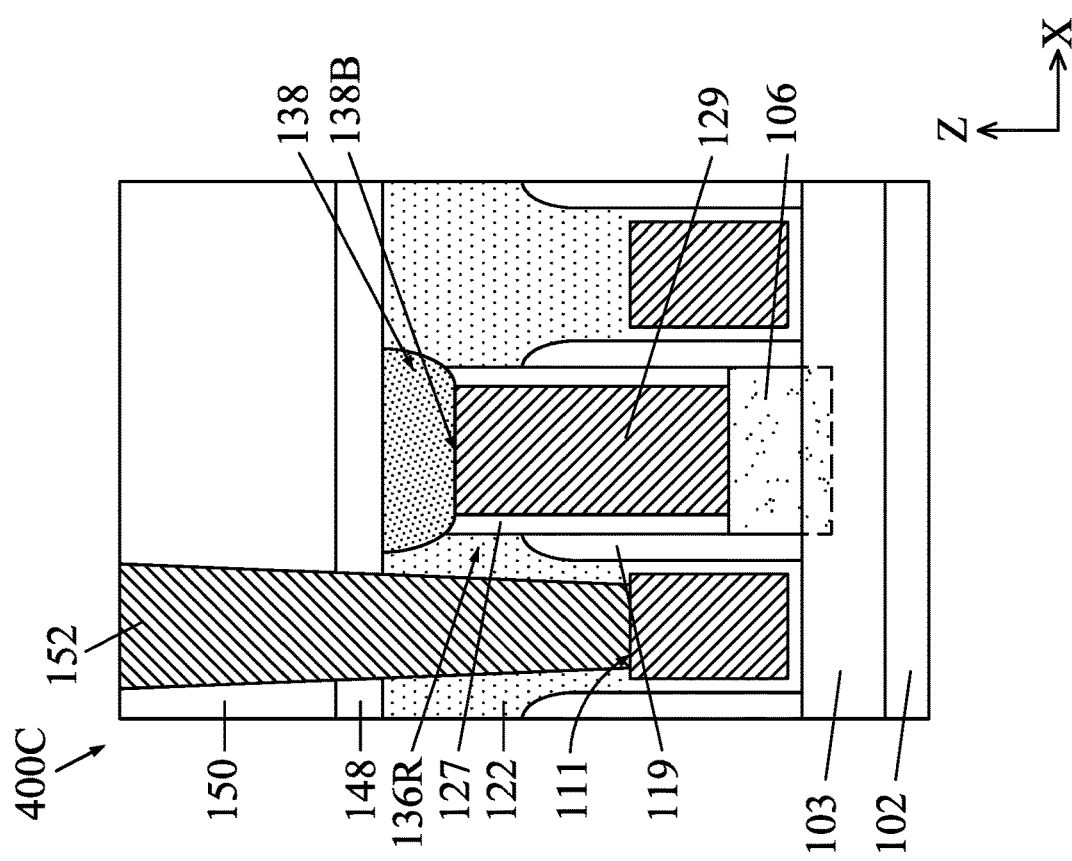

FIG. 4C is a portion of a cross-sectional view of a semiconductor device 400C which is a modification of the semiconductor device 200 of FIG. 2I-1, in accordance with some embodiments. The semiconductor device 400C is similar to the semiconductor device 200 of FIG. 2I-1 except the second mask layer 138, in accordance with some embodiments. The second mask layer 138 has no lower portion extending between the contact liners 127, as shown in FIG. 4C, in accordance with some embodiments. The bottom surface 138B of the second mask layer 138 is located at substantially the same level as the upper surface of the contact liner 127. As a result, the source/drain via 154 (as shown in FIG. 2I-2) landing on the source/drain contact 129 may be shorter, thereby reducing the resistance of the source/drain via 154.

FIG. 4D is a portion of a cross-sectional view of a semiconductor device 400D which is a modification of the semiconductor device 400C of FIG. 4C, in accordance with some embodiments. The semiconductor device 400D is similar to the semiconductor device 400C of FIG. 4C except that the gate via 152A is offset toward the source/drain contact 129, as shown in FIG. 4D in accordance with some embodiments. The gate via 152A lands on a portion of the gate stack 111 and covers a portion of the second mask layer 138, in accordance with some embodiments. Because the second mask layer 138 may protect the first mask layer 122 during the etching process for forming the gate via hole, the via-to-gate overlay window and the TDDB window of the semiconductor device may be improved, which may enhance the reliability of the semiconductor device.

Figure 5C:
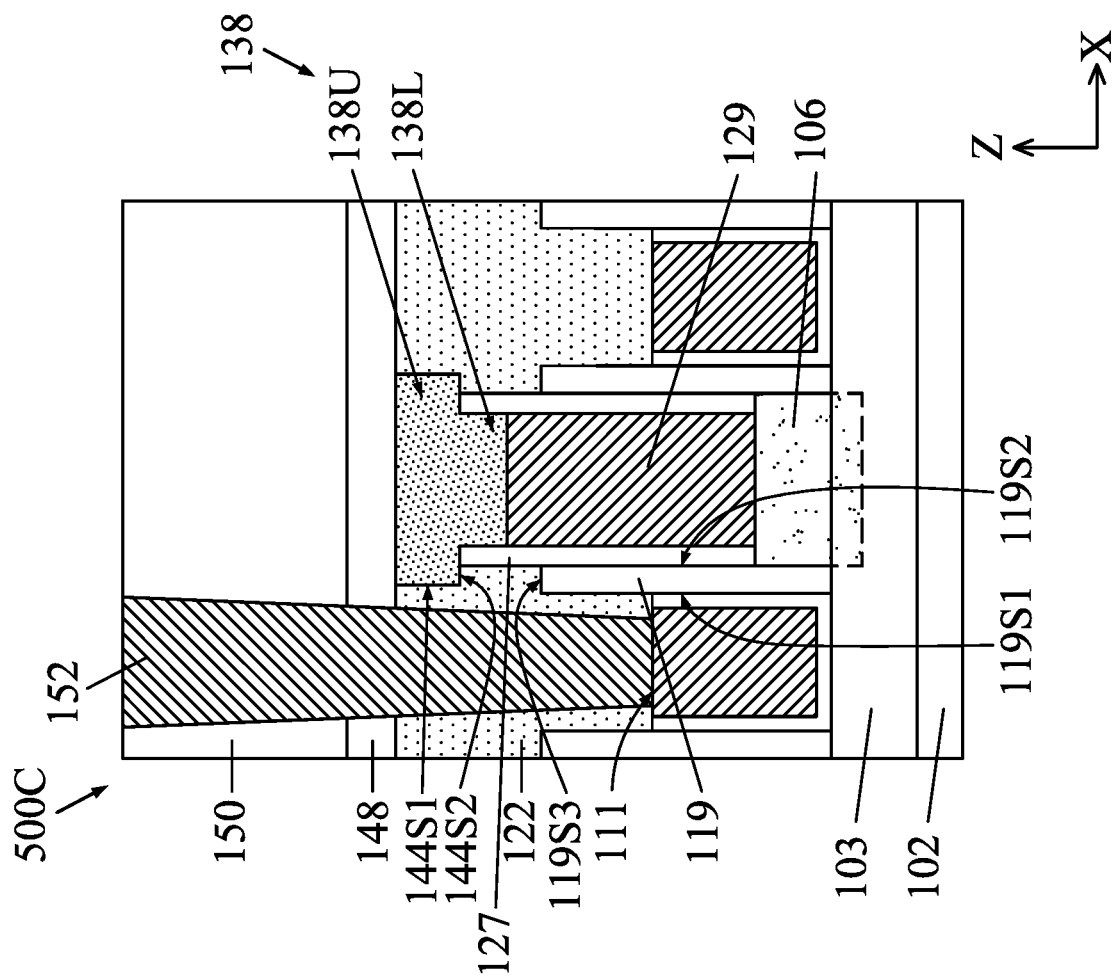

FIG. 5A, 5B, and 5C are portions of a cross-sectional view of semiconductor devices 500A, 500B and 500C which are modifications of the semiconductor device 200 of FIG. 2I-1, in accordance with some embodiments.

The semiconductor device 500A is similar to the semiconductor device 200 of FIG. 2I-1 except that the second mask layer 138 has a T-shape rather than a bowl shape, as shown in FIG. 5A, in accordance with some embodiments. The protruding portion 144 has two substantially flat surfaces 144S1 and 144S2 constituting a convex profile, in accordance with some embodiments. The surface 144S1 is substantially perpendicular to the surface 144S2, in accordance with some embodiments.

The semiconductor device 500B is similar to the semiconductor device 200 of FIG. 2I-1 except for the gate spacer layer 119, as shown in FIG. 5B, in accordance with some embodiments. In some embodiments, the gate spacer layer 119 has a substantially flat outer sidewall 119S1, a substantially flat inner sidewall 119S2, and a substantially flat upper surface 119S3 connecting the outer sidewall 119S1 and the inner sidewall 119S2.

The semiconductor device 500C is similar to the semiconductor device 500B of FIG. 5B except that the second mask layer 138 has a T-shape, as shown in FIG. 5C, in accordance with some embodiments. The protruding portion 144 has two substantially flat surfaces 144S1 and 144S2 constituting a convex profile, in accordance with some embodiments. The surface 144S1 is substantially perpendicular to the surface 144S2, in accordance with some embodiments.

As described above, the method for forming a semiconductor device structure includes forming a gate stack 111 over a substrate 102, forming a first mask layer 122 covering the gate stack 111, forming a contact 129 alongside the gate stack 111 and the first mask layer 122, recessing the contact 129, etching the first mask layer 122, and forming a second mask layer 138 covering the contact 129 and a portion of the first mask layer 122. Because the second mask layer 138 may protect the first mask layer 122 during the subsequent etching process, the via-to-gate overlay window and the TDDB window of the semiconductor device may be improved, which may enhance the reliability of the semiconductor device.

Embodiments of a method for forming a semiconductor device structure are provided. The method for forming the semiconductor device structure may include forming a first mask layer covering the gate stack, forming a contact alongside the gate stack and the first mask layer, recessing the contact, etching the first mask layer, and forming a second mask layer covering the contact and a portion of the first mask layer. The second mask layer may protect the first mask layer during the subsequent etching process. As a result, the via-to-gate overlay window and the TDDB window of the semiconductor device may be improved, which may enhance the reliability of the semiconductor device.

In some embodiments, a semiconductor device structure is provided. The semiconductor device structure includes a contact over a source/drain region of a fin structure, a gate stack over a channel region of the fin structure, a first mask layer covering the gate stack, and a second mask layer covering the contact. A side surface of the first mask layer is direct contact with a side surface of the second mask layer, and the first mask layer includes a portion directly below the second mask layer.

In some embodiments, a semiconductor device structure is provided. The semiconductor device structure includes a gate stack across a fin structure, a gate spacer layer along a sidewall of the gate stack, a first mask layer above and overlapping the gate stack and the gate spacer layer, a source/drain feature over the fin structure, a contact on the source/drain feature, and a second mask layer above and overlapping the contact and the gate spacer layer.

In some embodiments, a method for forming a semiconductor device structure is provided. The method includes forming a source/drain feature over a fin structure, forming a gate stack across the fin structure, forming a first mask layer on the gate stack, forming a contact on the source/drain feature, and etching the contact and the first mask layer to form a first recess. A side surface of the first mask layer and a top surface of the contact are exposed from the first recess. The method also includes forming a second mask layer in the first recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a contact over a source/drain region of a fin structure;
   a gate stack over a channel region of the fin structure;
   a first mask layer covering the gate stack; and
   a second mask layer covering the contact, wherein a side surface of the first mask layer is in direct contact with a side surface of the second mask layer, and the first mask layer includes a portion directly below the second mask layer, wherein a top surface of the first mask layer and a top surface of the second mask layer are substantially leveled.

2. The semiconductor device structure as claimed in claim 1, further comprising:
   a gate spacer layer between the contact and the gate stack, wherein the portion of the first mask layer is located directly above the gate spacer layer.

3. The semiconductor device structure as claimed in claim 2, further comprising:
   a contact liner between the gate spacer layer and the contact, wherein the contact liner is located directly below the second mask layer.

4. The semiconductor device structure as claimed in claim 2, wherein a bottom surface of the second mask layer is higher than a top of the gate spacer layer.

5. The semiconductor device structure as claimed in claim 2, wherein a top surface of the gate stack is lower than a top of the gate spacer layer.

6. The semiconductor device structure as claimed in claim 1, further comprising:
   a first via through the second mask layer and on the contact; and
   a second via through the first mask layer and on the gate stack.

7. The semiconductor device structure as claimed in claim 1, further comprising:
   an interlayer dielectric layer adjoining the first mask layer and the second mask layer, wherein a top surface of the interlayer dielectric and the top surface of the second mask layer are substantially leveled.

8. A semiconductor device structure, comprising:
   a gate stack across a fin structure;
   a gate spacer layer along a sidewall of the gate stack;
   a first mask layer above and overlapping the gate stack and the gate spacer layer;
   a source/drain feature over the fin structure;
   a contact on the source/drain feature; and
   a second mask layer above and overlapping the contact and the gate spacer layer, wherein the first mask layer has a concave surface, and the second mask layer has a convex surface that is mated with the concave surface of the first mask layer.

9. The semiconductor device structure as claimed in claim 8, wherein the concave surface of the first mask layer is curved.

10. The semiconductor device structure as claimed in claim 8, wherein a bottom surface of the second mask layer is lower than a top of the gate spacer layer.

11. The semiconductor device structure as claimed in claim 8, further comprising:
    a via through the first mask layer and on the gate stack, wherein the via overlaps a top surface of the second mask layer.

12. The semiconductor device structure as claimed in claim 8, wherein the second mask layer has a T shape or a bowl shape in a cross-sectional view.

13. A semiconductor device structure, comprising:
    a first source/drain feature and a second source/drain feature on a fin structure;
    a gate stack sandwiched between the first source/drain feature and the second source/drain feature;
    an interlayer dielectric layer covering the first source/drain feature;
    a first mask layer covering the gate stack;
    a second mask layer covering the second source/drain feature, wherein the first mask layer is sandwiched between the interlayer dielectric layer and the second mask layer, and a first portion of the first mask layer is located directly below a second portion of the second mask layer; and
    an etching stop layer over and in direct contact with a top surface of the interlayer dielectric layer, a top surface of the first mask layer and a top surface of the second mask layer.

14. The semiconductor device structure as claimed in claim 13, wherein the top surface of the interlayer dielectric layer, the top surface of the first mask layer and the top surface of the second mask layer are substantially level to each other.

15. The semiconductor device structure as claimed in claim 13, further comprising:
    a contact between the second source/drain feature and the second mask layer, wherein a first interface between the first source/drain feature and the interlayer dielectric layer is lower than a second interface between the gate stack and the first mask layer, and the second interface is lower than a third interface between the contact and the second mask layer.

16. The semiconductor device structure as claimed in claim 15, further comprising:
    a first via through the second mask layer and on the contact; and
    a second via through the first mask layer and on the gate stack.

17. The semiconductor device structure as claimed in claim 13, further comprising:
    a first gate spacer layer between the gate stack and the first source/drain feature; and
    a second gate spacer layer between the gate stack and the second source/drain feature, wherein the first mask layer includes a third portion sandwiched between the first gate spacer layer and the second gate spacer layer.

18. The semiconductor device structure as claimed in claim 17, wherein the second mask layer overlaps the second gate spacer layer.

19. The semiconductor device structure as claimed in claim 17, wherein in a direction parallel to a longitudinal direction of the gate stack, the first mask layer is longer than the interlayer dielectric layer.

20. The semiconductor device structure as claimed in claim 13, wherein in a direction parallel to a longitudinal direction of the gate stack, the first mask layer is longer than the second mask layer.

* * * * *